(12) United States Patent
Chaichanavong et al.

(10) Patent No.: US 7,667,626 B1
(45) Date of Patent: Feb. 23, 2010

(54) ENUMERATIVE DC-RLL CONSTRAINED CODING

(75) Inventors: Panu Chaichanavong, Mountain View, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 12/110,921

(22) Filed: Apr. 28, 2008

Related U.S. Application Data

(60) Provisional application No. 60/914,538, filed on Apr. 27, 2007, provisional application No. 60/943,404, filed on Jun. 12, 2007.

(51) Int. Cl.
*H03M 7/00* (2006.01)
(52) U.S. Cl. .......................... 341/59; 341/58
(58) Field of Classification Search .................. 341/50, 341/51, 67, 65, 58, 59
See application file for complete search history.

(56) References Cited

U.S. PATENT DOCUMENTS

| | | | | |
|---|---|---|---|---|
| 6,961,888 | B2* | 11/2005 | Jin et al. | 714/752 |
| 7,161,507 | B2* | 1/2007 | Tomic | 341/51 |
| 7,265,691 | B2* | 9/2007 | Tomic | 341/87 |
| 2008/0224905 | A1* | 9/2008 | Reznik | 341/67 |

\* cited by examiner

*Primary Examiner*—Peguy JeanPierre

(57) ABSTRACT

Systems and methods are provided for encoding and decoding constrained codes using an enumerative coding graph. The constrained code may contain run-length and DC level limits. The enumerative coding graph contains a series of states and each state has two branches that lead to other states. Each state in the enumerative coding graph is assigned a cardinality. Configuring the structure of the graph and the cardinalities associated with each state allow the encoder to generate a code that conforms to defined constraints.

26 Claims, 33 Drawing Sheets

| 000 | 001 | 010 | 011 | 100 | 101 | 110 | 111 |
|---|---|---|---|---|---|---|---|
| 00,00 | 00,01 | 00,10 | 01,00 | 01,01 | 01,10 | 10,00 | 10,01 |

FIG. 15

ENUMERATIVE DC-RLL CONSTRAINED CODING

CROSS-REFERENCE TO RELATED APPLICATIONS

This application claims the benefit under 35 U.S.C. § 119 (e) of U.S. Provisional Application Nos. 60/914,538, filed Apr. 27, 2007 and 60/943,404, filed Jun. 12, 2007. The disclosures of these applications are all hereby incorporated by reference in their entirety.

BACKGROUND

This application relates to systems and method for encoding and decoding constrained codes. In particular, this application relates systems and methods for enumerative run-length limited (RLL) and DC limited constrained coding.

Constrained coding refers to a code in which there are limits or "constraints" placed on the codes that are used. For example, an RLL constraint limits the number of consecutive zeros or ones within the code. The limits used by constrained coding schemes produce codewords that are less prone to errors or in which errors are more readily detected and/or corrected.

Enumerative coding refers to an encoding and decoding technique in which data is encoded as a sum of a series pre-determined numbers, which may be referred to as "cardinalities". An enumerative encoder selects certain of the cardinalities to represent the data to be encoded and transmits the information on which cardinalities are selected to an enumerative decoder. The enumerative decoder, which has the same pre-determined cardinalities as the encoder, can reproduce the data using the information received from the encoder.

Enumerative coding techniques can be used to implement basic RLL constrained codes. Selecting certain values for the cardinalities within an enumerative encoder ensures that the codewords generated by that encoder is a desired RLL constraint. However, none of these enumerative coding techniques can be used to generate codes having additional or more complex constraints.

SUMMARY

Systems and methods for encoding and decoding constrained codes are provided. In particular, systems and methods for enumerative run-length limited (RLL) and DC limited constrained coding are provided.

Enumerative DC-RLL constrained coding may be provided through the use of an enumerative coding graph. An enumerative coding graph contains a series of states and each state has two branches that lead to other states. Each state in the enumerative coding graph is assigned a cardinality. During encoding, an enumerative encoder receives data and encodes that data using the enumerative coding graph. Starting at an initial state, an encoded output is generated by comparing the data with the cardinality associated with that state. Based on that comparison, a bit of the encoded output is generated. Based on the value of that bit, one of the branches from the state is selected and the state connected to the branch is selected as the next state. When the encoding is complete, the encoded output of the encoder is generated based on the path that was selected through various states and branches of the enumerative coding graph. In some embodiments, the output of an enumerative encoder is provided to a precoder in order to generate the constrained code. An enumerative decoder may receive a constrained code and trace that code through the enumerative coding graph used to generate the code in order to decode the original data.

An enumerative encoder can generate a constrained code using the enumerative coding graph because each state in the enumerative coding graph is selected based on the proceeding bits of the constrained code. Configuring the structure of the graph and the cardinalities associated with each state allow the encoder to generate a code that conforms to defined constraints. In some embodiments, the enumerative coding graph is constructed such that all of the states in the graph conform to a DC limiting constraint. In some embodiments, the cardinalities in the enumerative coding graph are selected to generate codes that conform to one or more RLL constraints.

In some embodiments, the size of an enumerative coding graph may be reduced by eliminating states from the graph such as redundant states, unused states, or states that do not conform to a desired constraint. Furthermore, defining states in terms of various properties of proceeding code portions may lead to a more efficient enumerative coding graph than an enumerative coding graph that contains every possible codeword iteration. Where precoders or other stages are used with the enumerative encoder to generate a constrained code, the enumerative coding graph may reflect the effect of these stages within the graph structure and computations. The size of an enumerative code graph may also be reduced by storing cardinalities using fewer bits than the bit-lengths of the cardinalities. The cardinality values may be selected or modified to reduce the span of the cardinalities to allow the cardinalities to be stored using fewer bits. Reduced bit-width cardinalities may also permit the use of reduced-bit logic within the enumerative encoder.

Data may be broken up into smaller portions and may be processed in parallel to improve encoding efficiency. If the encoding of a subsequent portion of the data may depend on the results of the encoding of a previous portion of the data, the subsequent portion may be encoded based on one possible result and later modified if another result occurred.

If data is provided to an encoder that has fewer bits than the encoder is designed to handle, this partial data may be appended to the beginning or to the end of a complete portion of data. If the partial data is appended at the beginning, the data may be encoded from a middle portion of the enumerative coding graph so that the encoding of the partial data terminates at the end of the graph. When enumerative encoding is started from the middle of an enumerative coding graph a state with a large cardinality may be selected as the first state. If the partial data word is appended at the end, the data may be encoded from the beginning of the enumerative coding graph and may end in the middle of the graph.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which.

Figure 12:
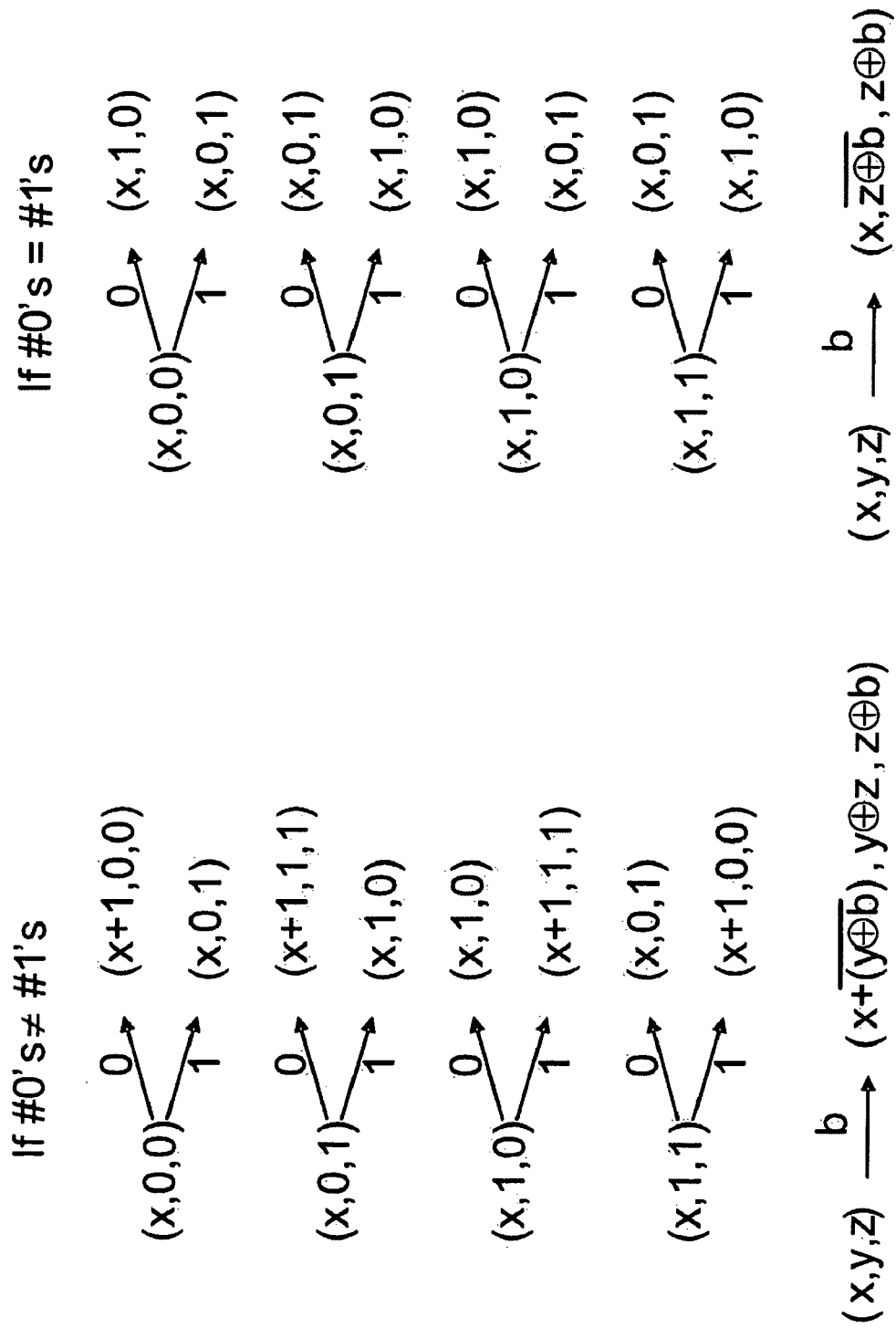
FIG. 12 is a diagram that illustrates the transitions from one state to the next state based on the next codeword bit using a $$\frac{1}{1+D^2}$$
Figure 13:
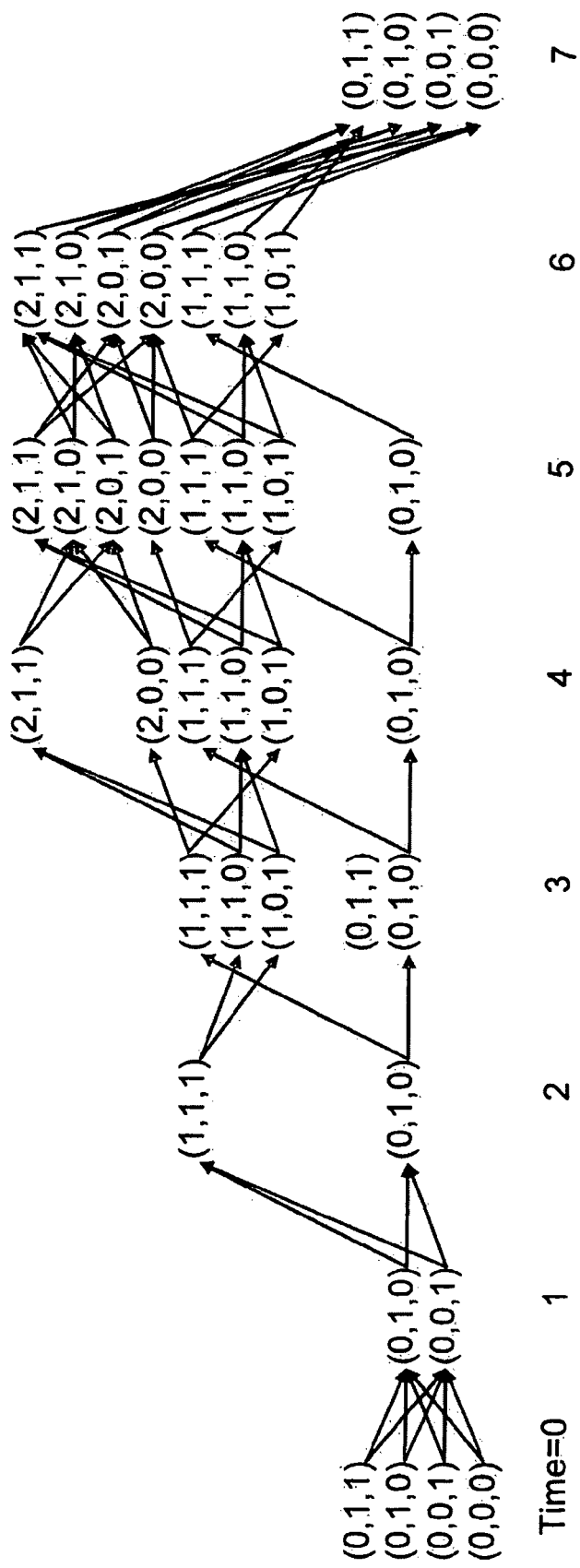
Figure 16:
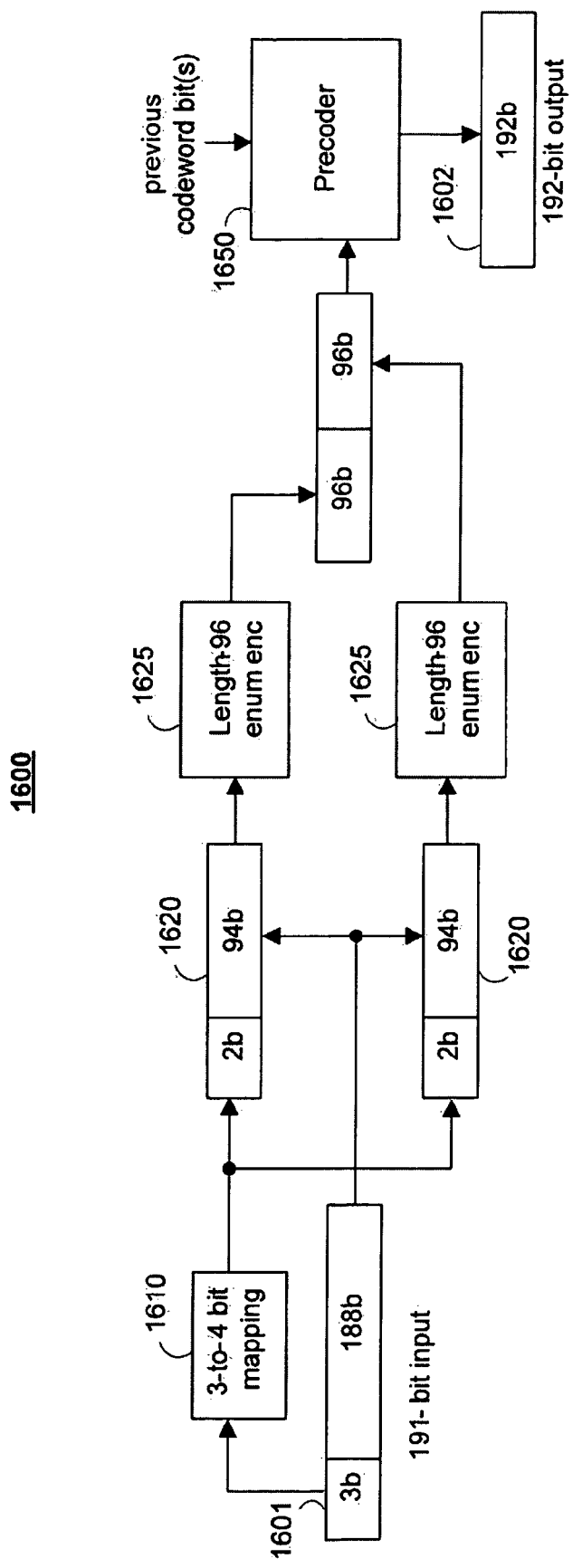
Figure 17:
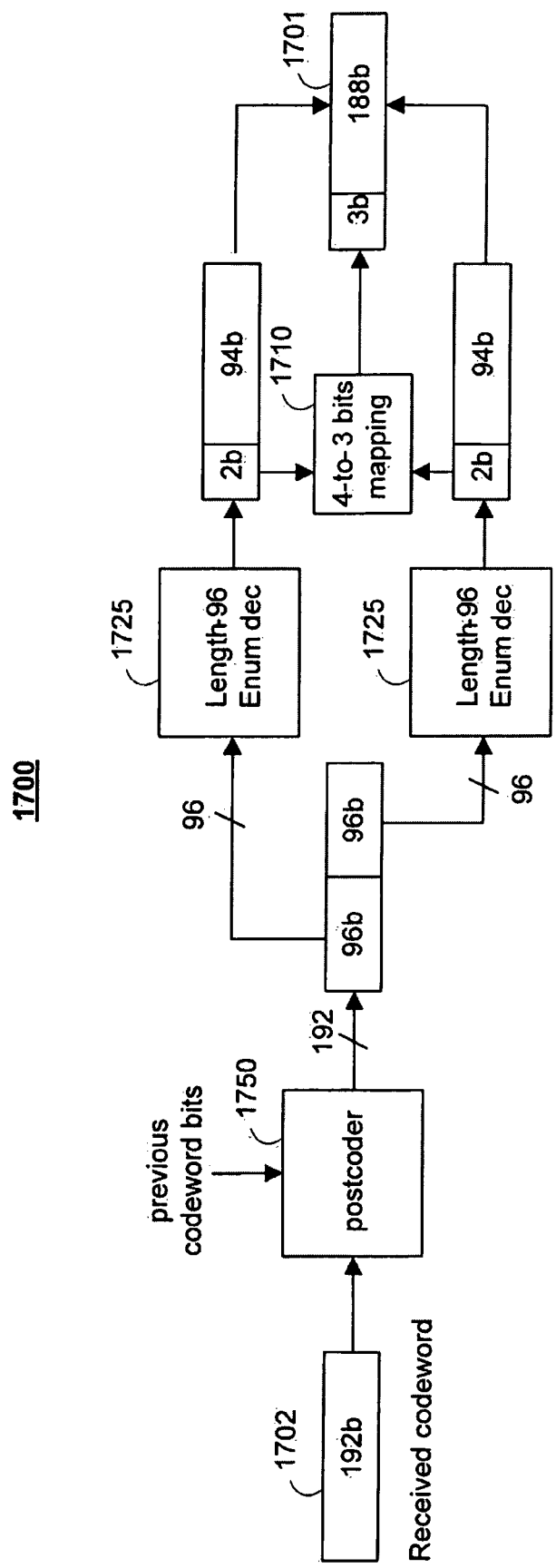
Figure 22:
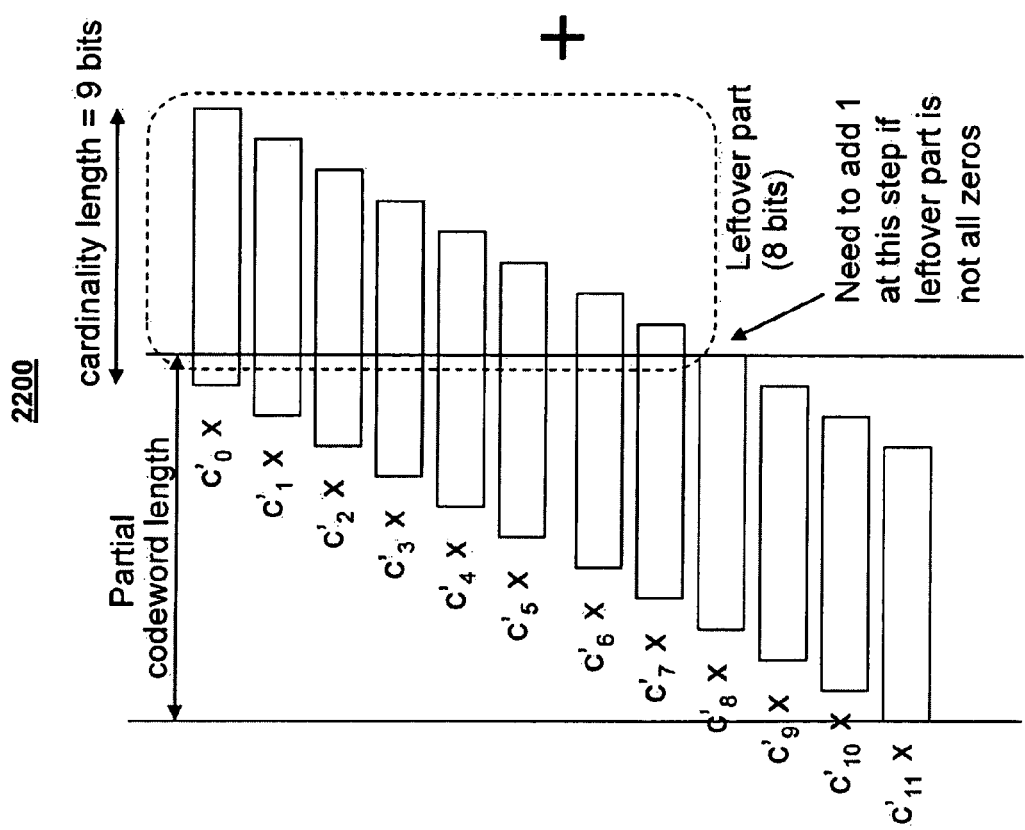
Figure 23A:
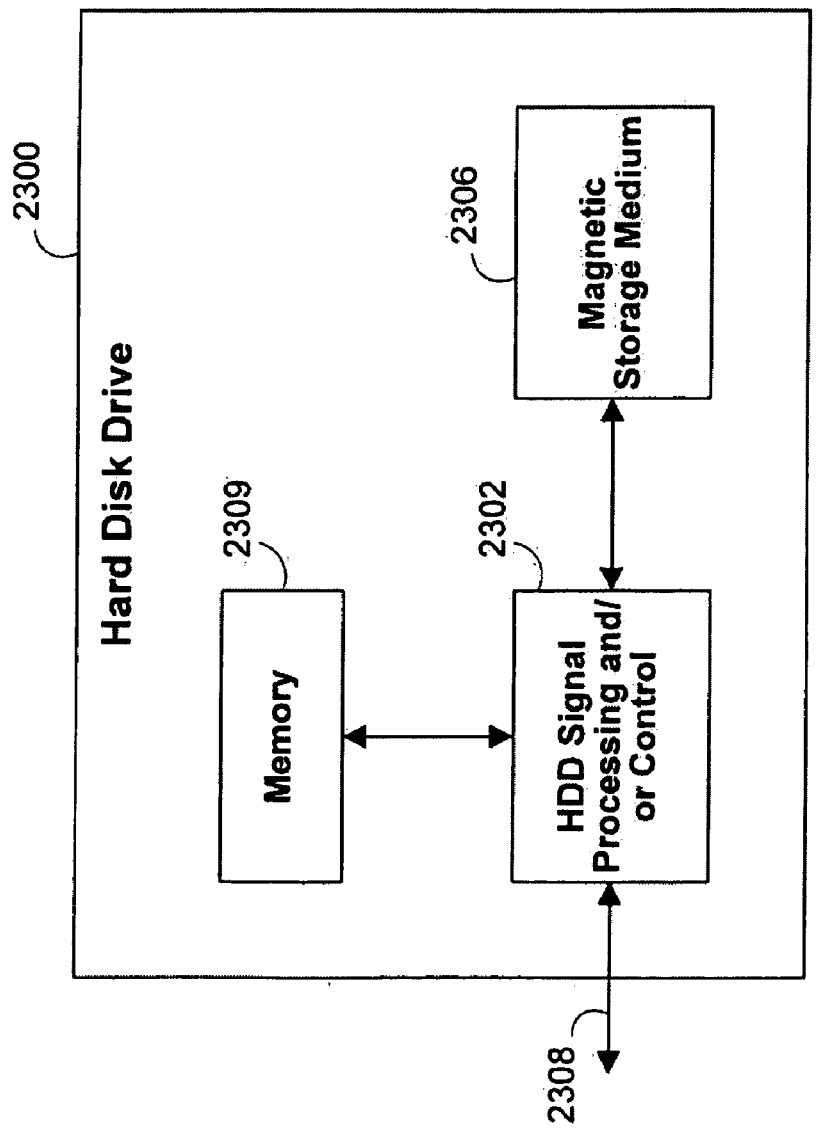
Figure 23B:
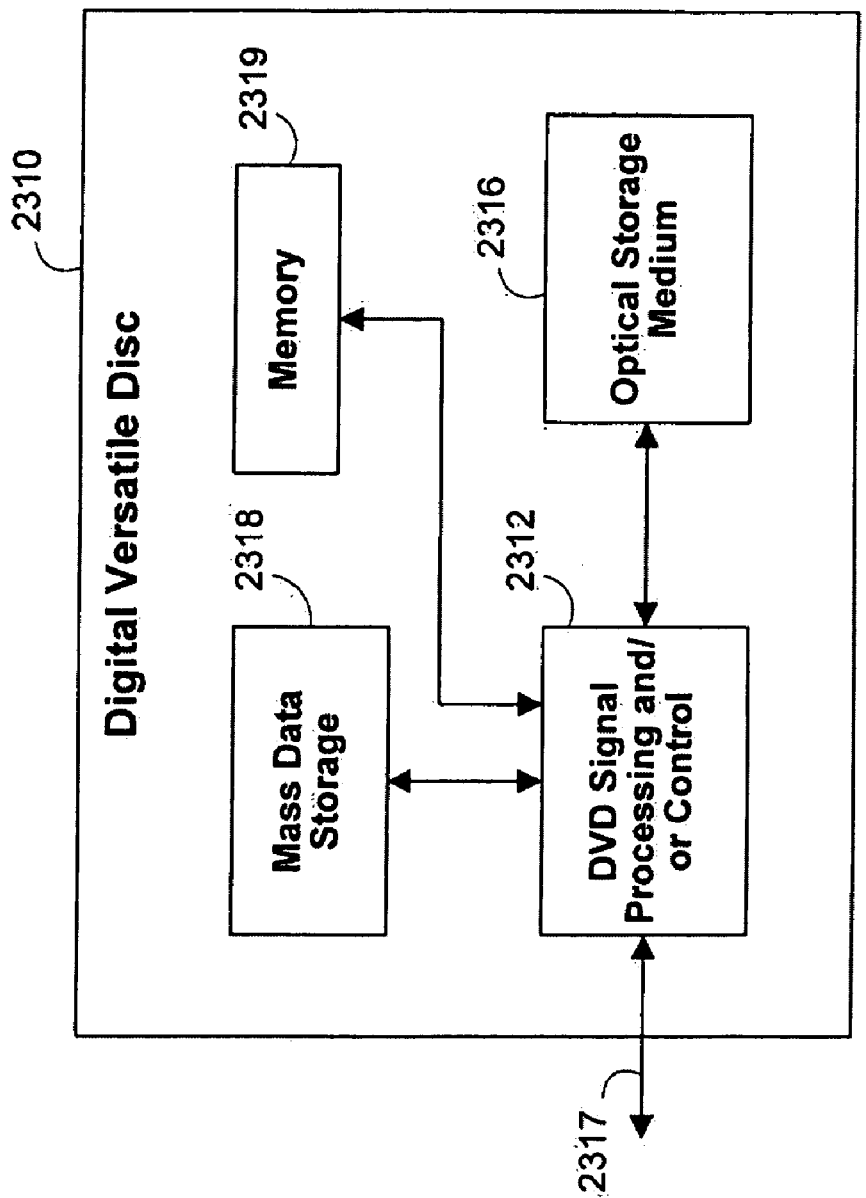
Figure 23C:
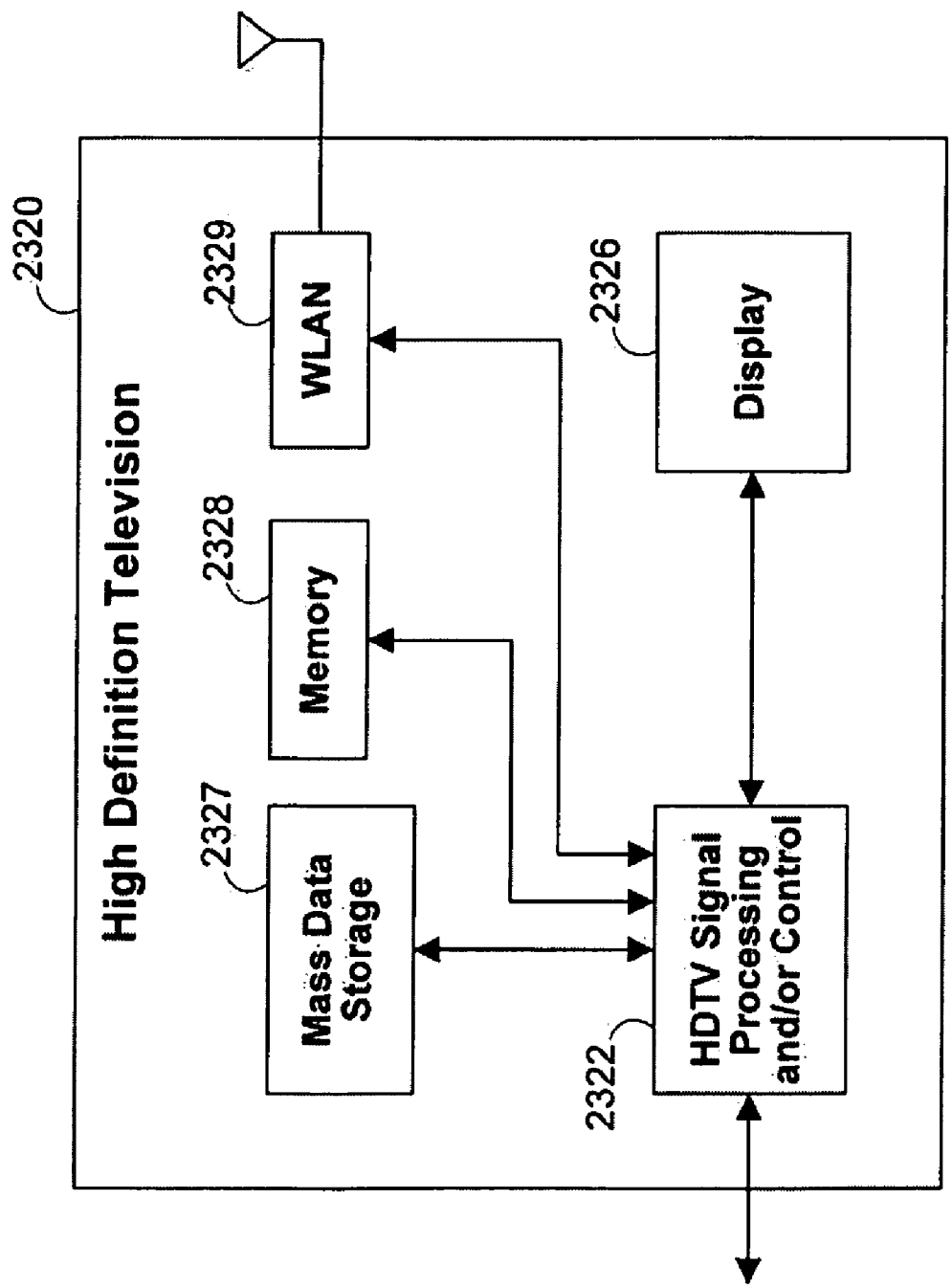
Figure 23D:
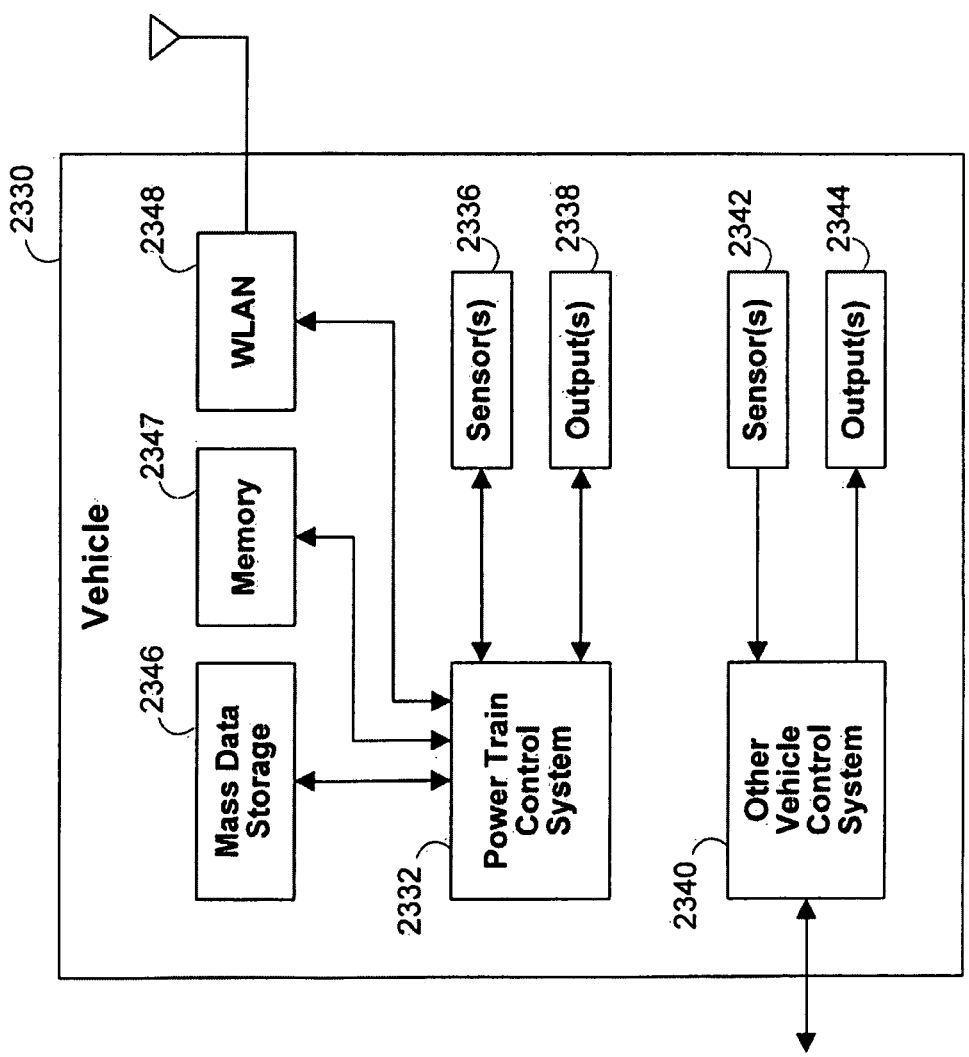
Figure 23E:
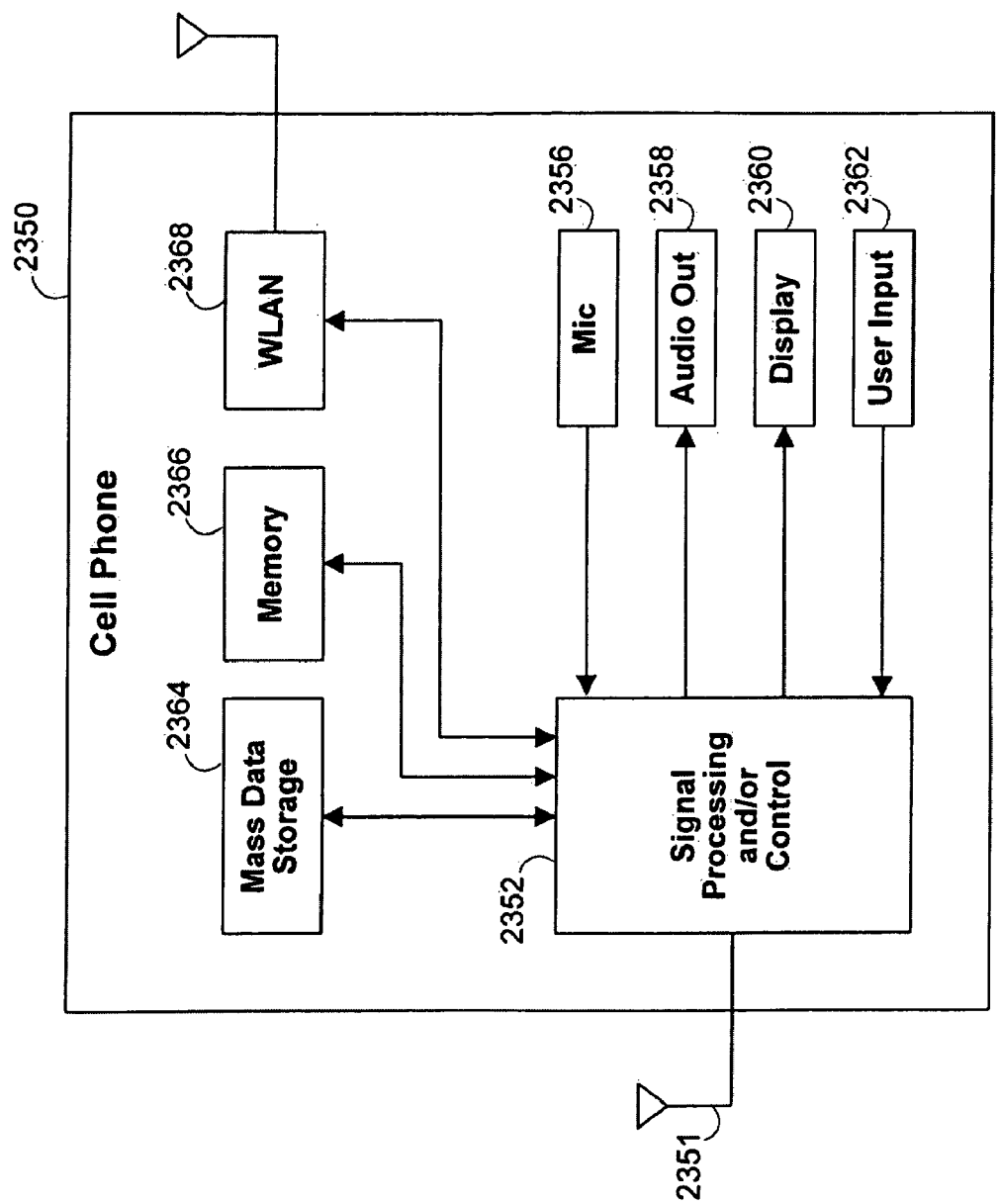
Figure 23F:
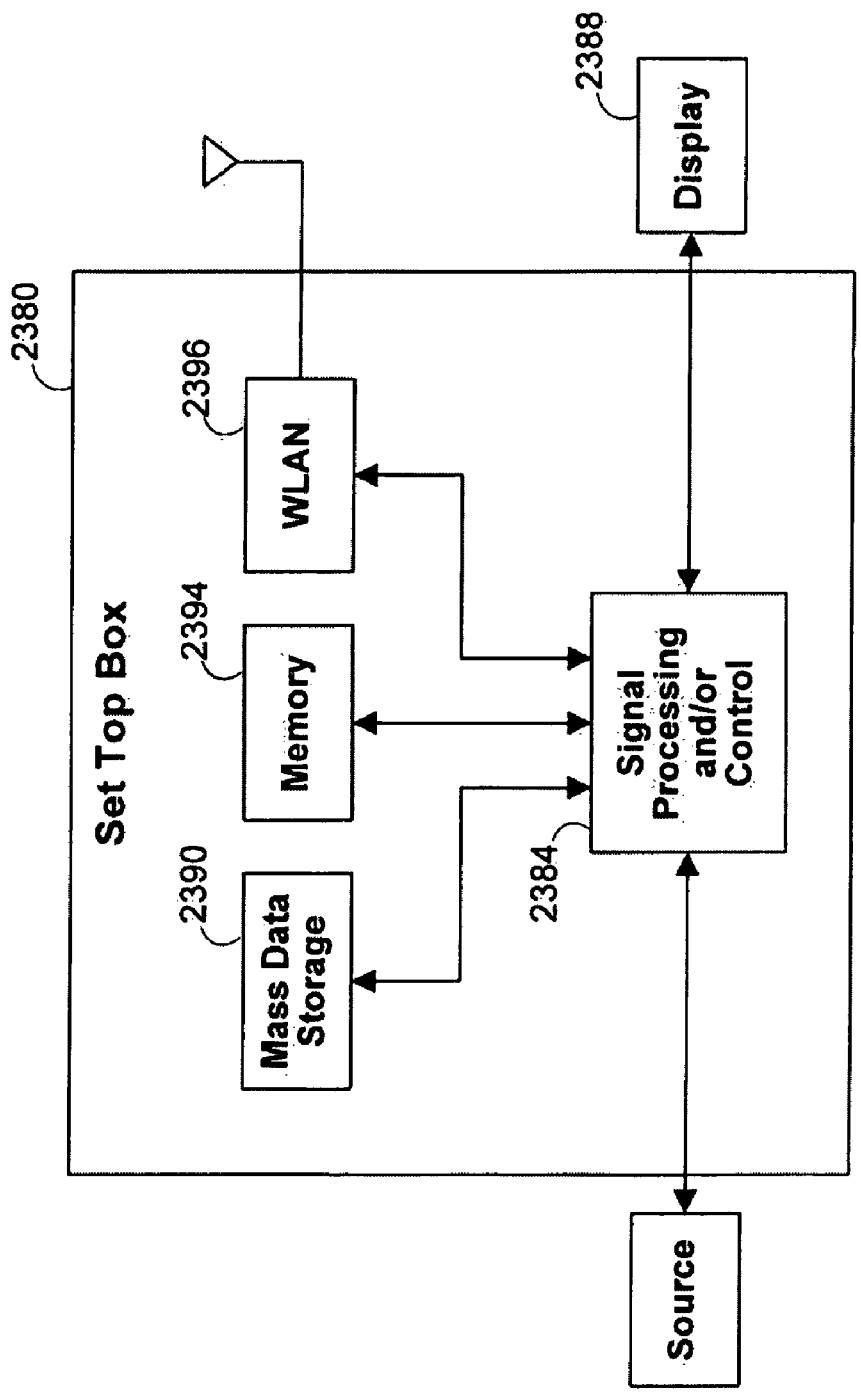
Figure 23G:
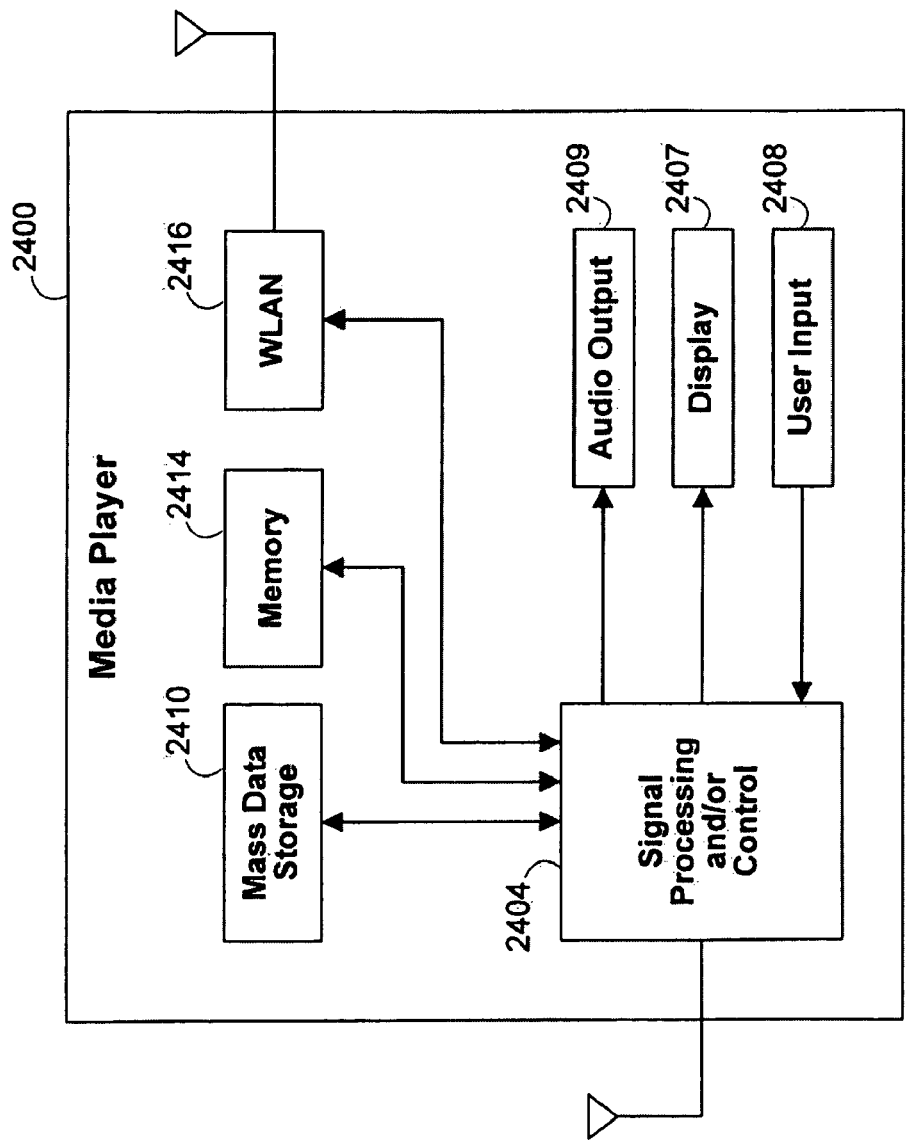

precoder;

FIG. 13 is an illustrative enumerative coding graph that can be generated based on the state transitions of FIG. 12;

FIGS. 14A-E are illustrative portions of enumerative coding graphs that show an approach for grouping and calculating the cardinality values;

FIG. 15 is an illustrative 3-to-4 bit mapping table;

FIG. 16 is an illustrative block diagram of an encoder that may be used to encode an enumerative constrained code;

FIG. 17 is an illustrative block diagram of a decoder that may be used to decode an enumerative constrained code;

FIGS. 18-21 are illustrative block diagrams of encoders that may be used to encode an enumerative constrained code that includes a partial dataword;

FIG. 22 is a diagram that illustrates a technique used to decode an enumerative constrained code generated from a partial codeword;

FIG. 23A is a block diagram of an exemplary hard disk drive that can employ the disclosed technology;

FIG. 23B is a block diagram of an exemplary digital versatile disc that can employ the disclosed technology;

FIG. 23C is a block diagram of an exemplary high definition television that can employ the disclosed technology;

FIG. 23D is a block diagram of an exemplary vehicle that can employ the disclosed technology;

FIG. 23E is a block diagram of an exemplary cell phone that can employ the disclosed technology;

FIG. 23F is a block diagram of an exemplary set top box that can employ the disclosed technology; and FIG. 23G is a block diagram of an exemplary media player that can employ the disclosed technology.

DETAILED DESCRIPTION

Systems and methods for enumerative DC-RLL constrained coding are provided. As used herein, the term "information" will refer to binary digits that may be physically embodied in many ways that are known in the art. As used herein, information to be encoded will be referred to as "user information," and information produced by an encoder based on user information will be referred to as "encoded information." As will be explained in greater detail below, the encoded information may be a constrained code. User information may include information that has already been encoded using another coding scheme such as an error correcting code (ECC). Similarly, the enumerative constrained coding techniques described below may be used in conjunction with an ECC or other suitable coding techniques.

In general, the functionality of the enumerative constrained coding is implemented in an encoder and a corresponding decoder. The primary operation of an encoder is to generate an n-symbol word from a k-symbol word in a particular way, where n and k are integers and n>k. The k-symbol word is called a "dataword," and the n-symbol word is called a "codeword." The primary operation of a corresponding decoder is to recover the dataword from the codeword.

A constrained code encoder produces codewords that satisfy certain predetermined constraints. Exemplary codeword constraints include, run-length limit (RLL) constraints, alternating RLL constraints, interleaved RLL constraints, and DC limit constraints. An RLL constraint limits the number of consecutive zeros or ones within a codeword. For example, an RLL constraint of four limits the number of consecutive zeros and ones to four consecutive bits. The codeword 11001100 would be permitted under this constraint, but 000001010 and 10111111 would not be permitted. Some RLL constraints apply to zeros and ones equally, while others may apply only to zeros or ones or many have different limits for each bit type. An alternating RLL constraint limits the number of consecutive alternating zeros and ones. For example, an alternating RLL constraint of length eight prohibits both 01010101 and 10101010, but not 01011010. An interleaved RLL constraint prohibits patterns such as 0x0x0x0x and 1x1x1x1x, where x is any suitable pattern. RLL constraints may be specified by a run-length profile. For example, a run-length profile for a zero RLL constraint may specify for each bit position in a codeword the maximum number of zeros that may follow that bit. Therefore the zero RLL constraint run-length profile 5, 9, 9, 9, ... 9, 8, 7, 6, 5, 4, 4, 3, 2, 1 specifies an RLL of 9 with at most five zeros at the beginning of a codeword and four zeros at the end.

Finally, a DC constraint limits the difference between the number of zeros and ones in a codeword. For example, a DC constraint of four may prohibit the codewords 00001010 and 10101111. The use of constrained codes may improve the performance of exemplary communication/storage system 100 shown in FIG. 1. Prohibited codewords may be more difficult to accurately detect than permitted codewords and may result in more communication or storage errors.

System 100 includes user information 102 that is intended for communication/storage. The user information 102 may be made up of a series of datawords. The user information 102 and the datawords can be encoded by enumerative encoder 104 to encoded information 105. Encoded information 105 can be made up of a series of constrained codewords. The encoded information can be modulated by modulator 106, which can perform electric-, magnetic-, or optical-based modulation, or another type of modulation. The modulator 106 transforms the encoded information 105 into one or more signals (not shown) that can be communicated over communications channel 108 where the one or more signals may be affected by noise. As used herein, "channel" refers to media, devices, and/or processing stages that occur between modulator 106 and detector/demodulator 110 and can correspond to a particular path of media/devices through which a signal can flow, a particular wavelength or time slot which a signal can utilize, and/or another multiple access scheme. For example, in FIG. 1, channel 108 can correspond to storage and write and read components of a disk drive, including a magnetic storage medium, a disk-drive read/write head, and other storage system components. In some cases, the term "channel" as used herein can also include the modulator 106 and the demodulator/detector 110. While in channel 108, the signals may encounter error-producing phenomena, such as device physical failure, device electrical failure, signal interference, and/or data loss due to buffer overflow, for example. The interference signals and other error-producing phenomena in a channel 108 will be referred to herein as "noise." As shown by the description above, the terms channel and noise are more conceptual than physical, but they correspond to physical aspects of a system.

Figure 1:
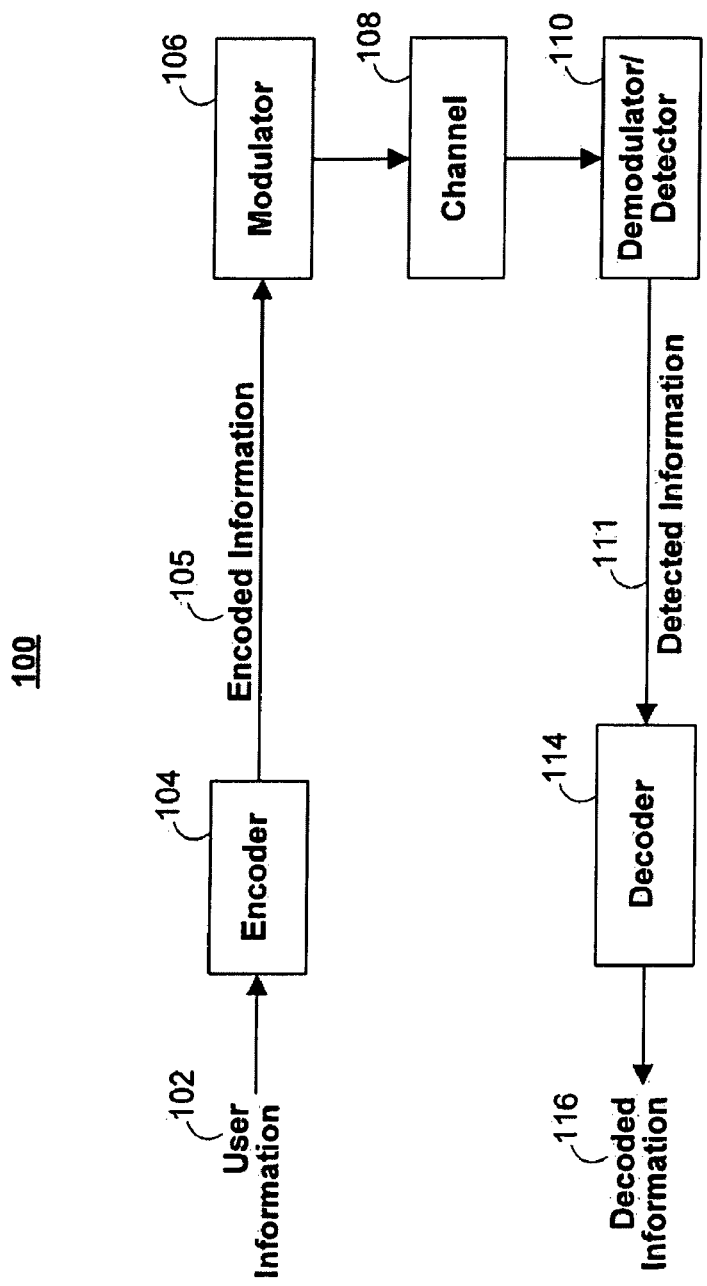
FIG. 1 is a block diagram of an exemplary communication/storage system that employs an enumerative constrained code.

With continuing reference to FIG. 1, the signals on channel 108 can be received by a demodulator/detector 110. Demodulator/detector 110 attempts to determine the encoded information 105, from a noisy signal. The result of the detector's determination will be referred to herein as detected information 111. Where the encoded information 105 is made up of a series of codewords, the detected information 111 will be made up of a series of detected codewords. If there are no errors in the detected information 111, the detected information 111 should be the same as the encoded information 105. If there are errors, however, the demodulator/detector 110 may be able to correct some or all of the errors. If the demodulator/detector 110 is able to correct all of the errors, the detected information 111 will be the same as the encoded information 105. Detected information 111 is provided to enumerative decoder 114. If the detected information 111 is the same as the encoded information 105, enumerative decoder 114 may produce decoded information 116 that should be the same as user information 102.

Enumerative encoding is one technique that may be used to implement RLL constrained coding. The following is an example that illustrates the operation of an RLL constrained enumerative coding scheme for 8-bit datawords that produces 9-bit codewords with a zero run-length limit of two (i.e., only two consecutive 0's are permitted). Nine cardinalities are provided: $W_8=125$, $W_7=68$, $W_6=37$, $W_5=20$, $W_4=11$, $W_3=6$, $W_2=3$, $W_1=2$, $W_0=1$. Each of these cardinalities is associated with respective codeword bits. 8-bit dataword 01010001 (i.e., 81 decimal) may then be encoded using these cardinalities by encoding this dataword as $W_7+W_4+W_1$ (68+11+2=81). In resulting codeword form, each bit associated with a cardinality used within the sum maybe written as a zero and the remaining bits are written as ones. Thus, the resulting codeword from this example would be 101101101 (with zeros at bit positions 7, 4, and 1 to represent cardinalities $W_7$, $W_4$, and $W_1$). It can be seen that this codeword may be easily decoded as long as the cardinalities associated with each bit of the codeword are known to the decoder. While this illustrative enumerative encoding scheme can be used to produce an ordinary RLL constrained codes, the enumerative encoding scheme is unable to produce the other types of constrained codes discussed above such as alternating RLL constrained codes, interleaved RLL constrained codes, or DC limited constrained codes. One limit of enumerative encoders is that enumerative encoders may not be able to generate codewords for every possible dataword input. In particular, the sum of all of the cardinalities may be less than the value of the largest potential dataword. Therefore, some decoders limit the size of the dataword input.

In some embodiments, a precoder may be used within the encoder in order to further process a codeword produced by an enumerative encoder. The precoder may be included as part of encoder 104 or may be inserted at the output of encoder 104. The precoder may be used to perform a reversible operation on a codeword as an additional step in the encoding process. One benefit of using a precoder in this manner is that the precoder may provide a computationally efficient way to supplement a previous encoding stage such as an enumerative encoder. For example, the RLL enumerative encoder described above outputs a zero run-length limited output. A precoder may be used to transform a zero run-length limited codeword into a codeword that is run-length limited for both zeros and ones. By using a precoder to perform this operation, the design of an RLL constrained code encoder may be simplified. Two exemplary precoder types that may be used for this purpose will be described below.

A first precoder type is a $$\frac{1}{1+D}$$

precoder. Written in the time domain at a given time k, where X is the input to the precoder and Y is the output of the precoder $X_k=Y_k+Y_{k-1}$. In other words, for each bit input to this precoder, the output bit is calculated based on the previous output bit. When a zero bit is input to this precoder, the output bit is equal to the previous output bit. When a one bit is input to the precoder, the output bit is the opposite of the previous output bit. Thus it can be seen that this precoder may be useful when applied to a zero run-length limited code. A string of ones will be converted to an alternating string of ones and zeros, while a string of zeros (which will be limited by the zero run-length limited enumerative encoder) will either remain a string of zeros or be converted to a string of ones (depending on whether the previous output bit was a zero or one). When applied to a zero run-length limited code this precoder will output an RLL code that limits zeros and ones. For example, the codeword 11110110 would be converted to 10100100 (assuming that the previous output bit is a zero).

The second precoder type is a $$\frac{1}{1+D^2}$$

precoder, which operates in the same manner as the $$\frac{1}{1+D}$$

precoder, except that the current output bit is generated based on the bit output two time slots before the current output. Thus, the codeword 11110110 would be converted to 11000111 (assuming that the two previous output bits are zeros). As used herein for a codeword that is processed using a precoder, the codeword is said to be in the user domain or an enumerative codeword before preceding and in the non return to zero (NRZ) domain or a constrained codeword after the preceding.

Figure 2:
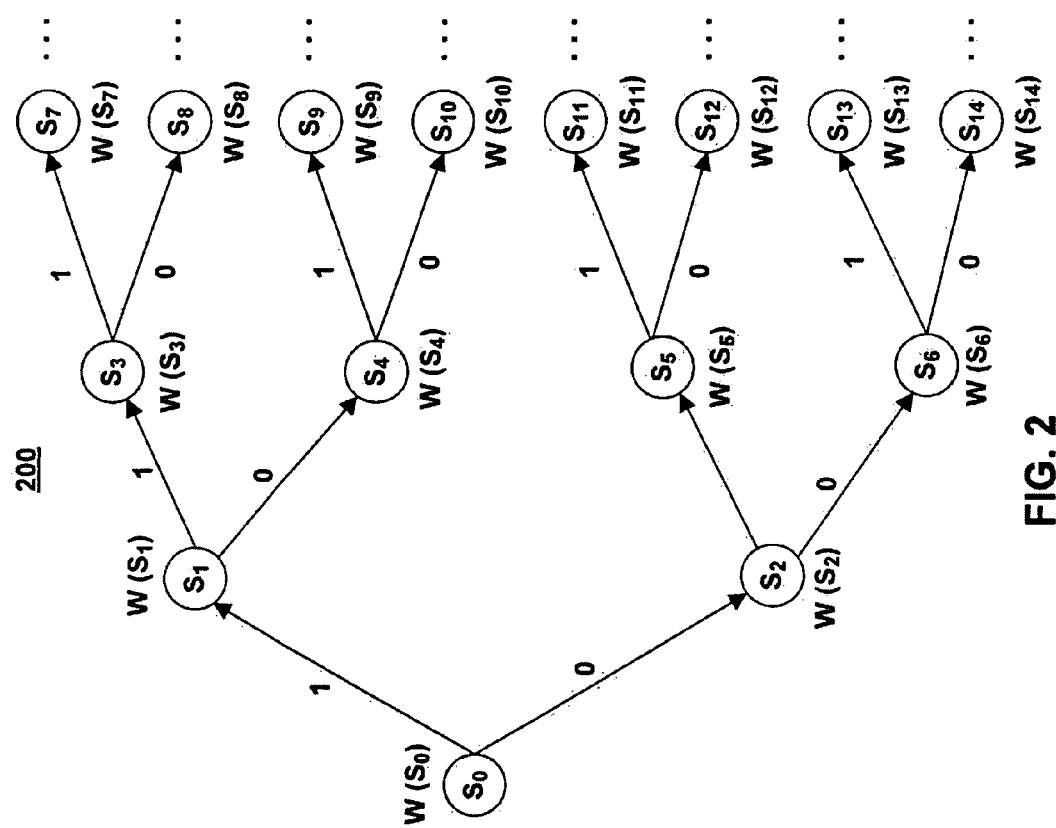
FIG. 2 is a portion of an illustrative enumerative coding graph that may be used to generate an enumerative constrained code.

FIG. 2 is a portion of an illustrative enumerative coding graph 200 that may be used to generate a enumerative constrained code in accordance with one embodiment of the present invention. Encoding may be performed along the graph. Each state in the graph, $S_0$ through $S_{14}$, is assigned a cardinality, $W(S_0)$ through $W(S_{14})$. For example, when encoding a dataword, the dataword is compared at each state with the cardinality associated with that state. If the dataword is less than the cardinality at that state, then one is output for that bit of the codeword and the coding continues to the next state along the one branch of the graph. If the dataword is greater or equal to the cardinality at that state, then zero is output for that bit of the codeword, the value of the cardinality is subtracted from the dataword, and the coding continues with the modified dataword to the next state along the one branch of the graph. A more detailed example of this encoding process will be described below with reference to FIGS. 4-7.

As with the previously discussed typical RLL enumerative encoding scheme, the codeword produced represents the encoded dataword as a sum of cardinalities. However, the present encoding scheme may be used to output codewords that may satisfy additional and possibly more complex constraints such as a DC-RLL constraint. These constraints may be enforced by tracking each codeword, bit-by-bit, along graph 200, which allows cardinalities to be set for each state that take into account all of the previous bits of the codeword. Therefore, as will be described in greater detail below, an enumerative encoder using a graph such as graph 200 may be used for enumerative DC-RLL constrained coding including any RLL type or other suitable constraint.

Figure 3:
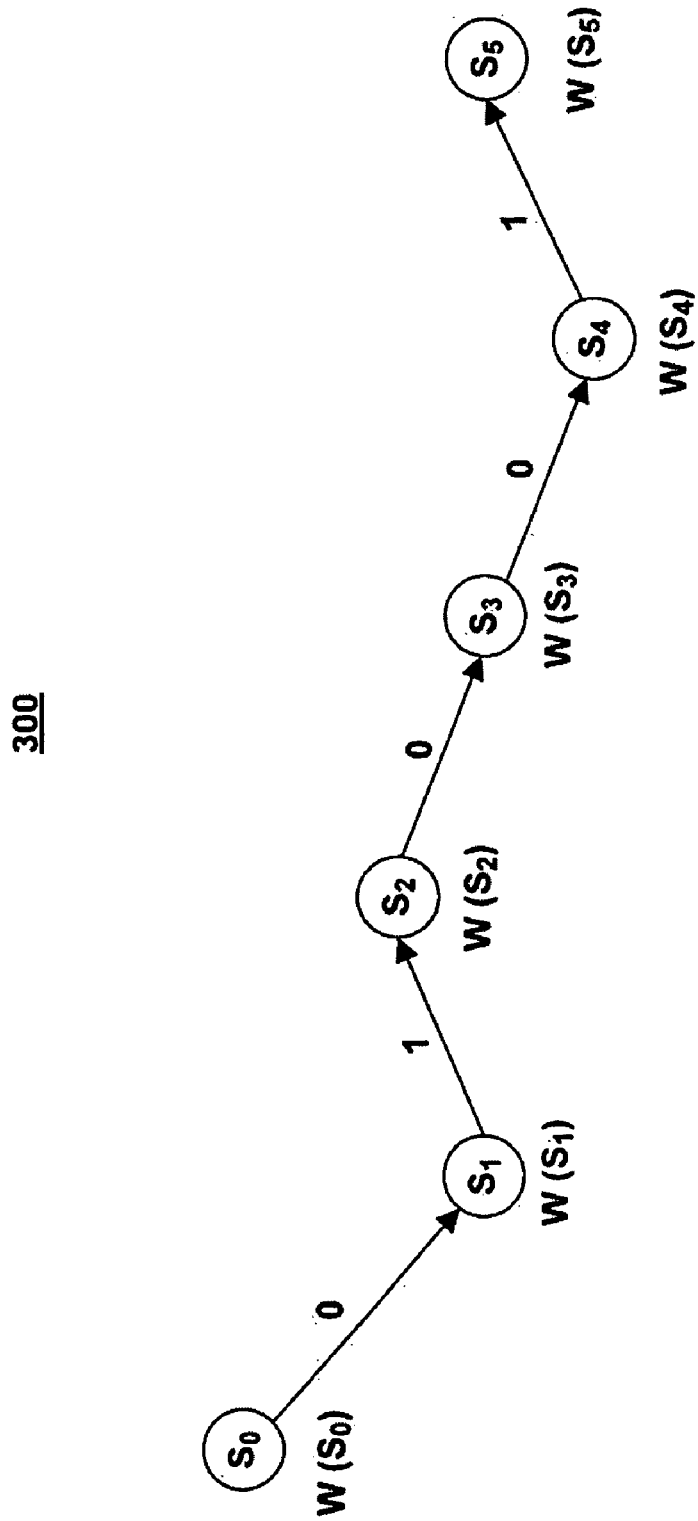
FIG. 3 is a portion of an illustrative enumerative coding graph that may be used to decode an enumerative constrained code.

FIG. 3 shows a portion of an illustrative enumerative coding graph 300 that may be used to decode an enumerative coding constrained code. If the graph used to encode an enumerative codeword is known by the decoder, the decoder may trace a path back through to obtain the encoded dataword. FIG. 3 only, illustrates this path, omitting the remaining states. For example, as illustrated by graph 300, the codeword 01001 can be decoded by tracing a path through the graph following the branches associated with the codeword and summing the cardinalities of the states that are associated with zeros. Thus, illustrated codeword 01001 can be decoded as the sum of $W(S_0)$, $W(S_2)$, and $W(S_3)$. It should be noted that while the illustrative enumerative encoding scheme described with reference to FIGS. 1 and 2, use zeros within the codeword to indicate the cardinalities that are used to encode the dataword, other suitable encoding schemes may also be used. For example, ones or more complex patterns of zeros and ones may also be used to represent the cardinalities within an encoded codeword.

While a full enumerative coding graph such as graph 200 may be used for enumerative DC-RLL constrained coding, the size of such a graph may be prohibitive. For example, a full graph for encoding a 7-bit dataword into a 8-bit data word would require 255 states and cardinalities and this number grows exponentially with the number of bits to be encoded. Therefore, it may be useful to create a graph with as few states as possible and to group states together that can be assigned the same cardinality. FIGS. 4-7 show an illustrative example of enumerative DC-RLL constrained coding using a reduced graph. The creation of such graphs and techniques for assigning cardinalities to states within a graph will be described in greater detail below with reference to FIGS. 8-15.

Figure 4:
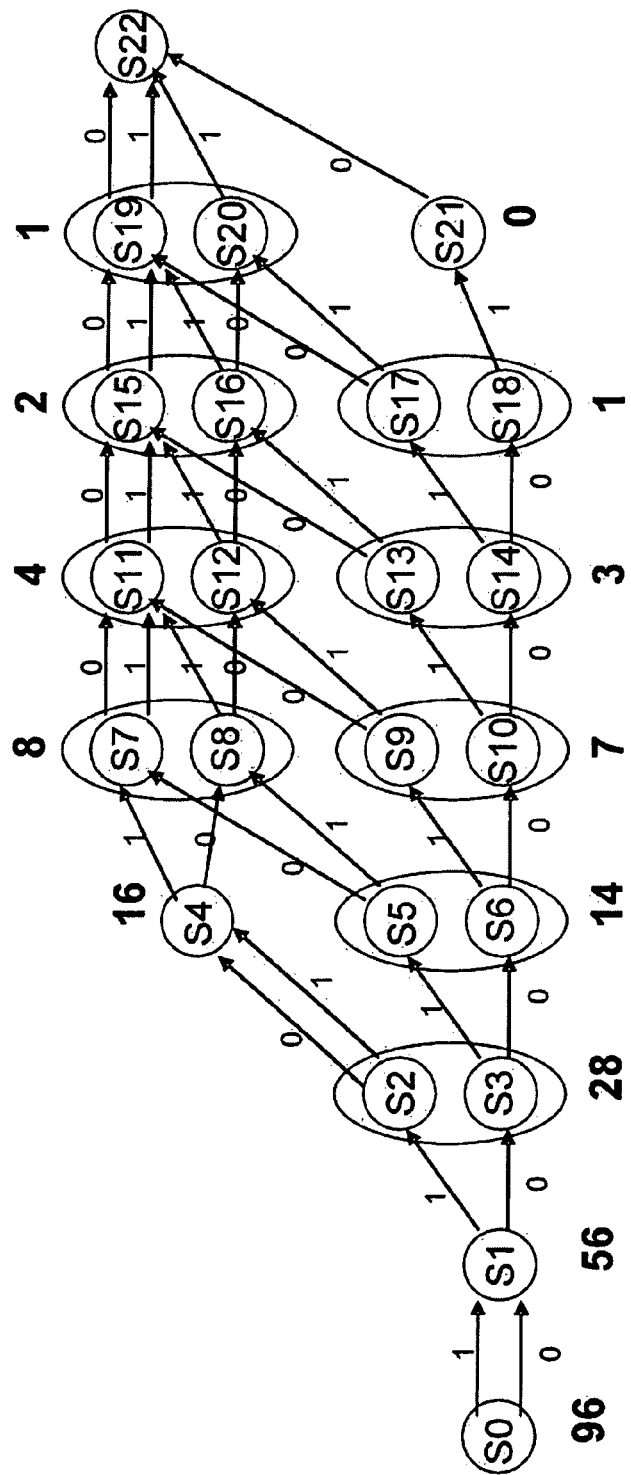
FIG. 4 is another illustrative enumerative coding graph that may be used to encode an enumerative constrained code.

FIG. 4 shows an illustrative enumerative coding graph 400 that may be used for enumerative constrained coding. In particular, graph 400 is an exemplary graph that can be used to encode a 7-bit dataword into an 8-bit codeword. The bolded numbers above and below the states are the cardinalities associated with those states. States that are included within the same oval, e.g., states $S_2$ and $S_3$, share the same cardinality. In contrast to the full graph, described, which would require 255 states and 255 individual cardinalities to encode a 7-bit dataword graph 400 only includes 23 states and 13 cardinalities. Using a similar enumerative coding graph structure a 96-bit dataword can be encoded using four concatenated 24-bit graph portions each having only 198 states and 93 cardinalities. The construction of an enumerative coding graph such as graph 400 will be described in more detail below.

Figure 5:
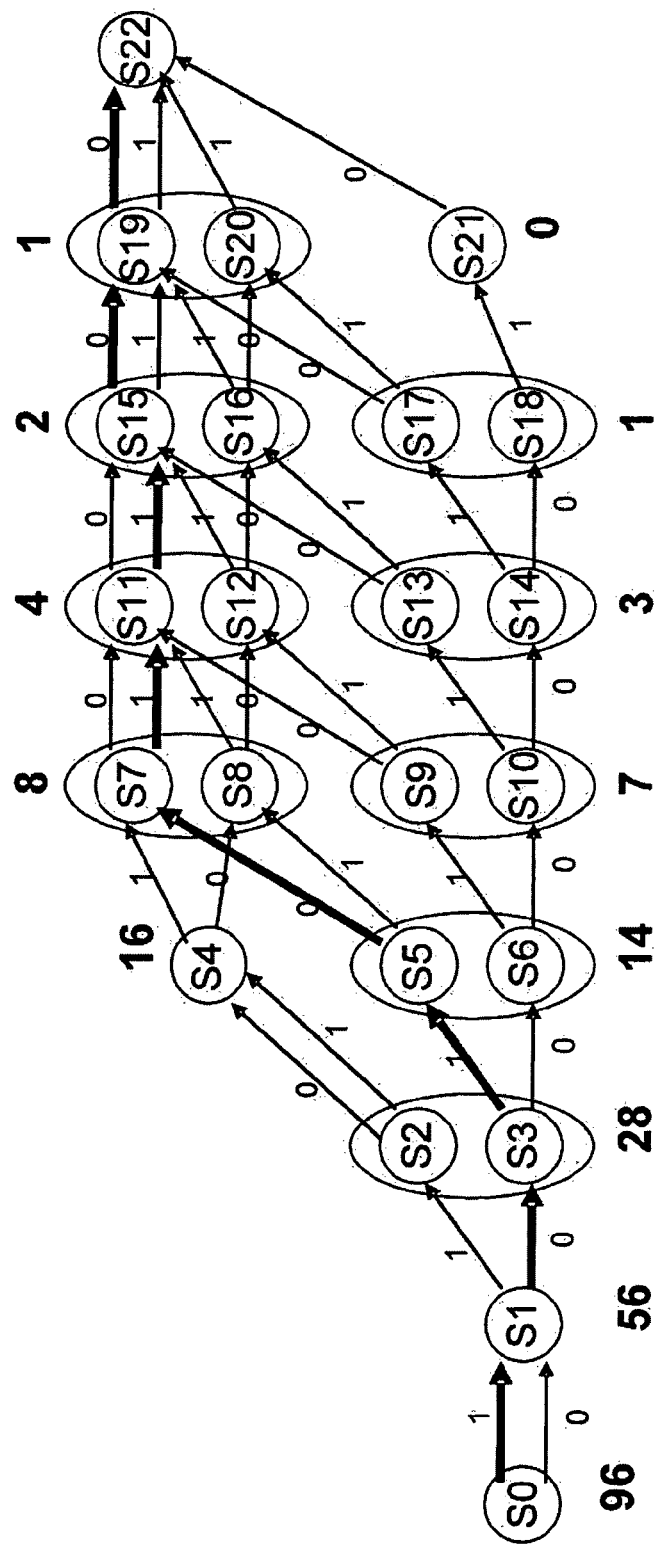
FIG. 5 is a modified version of the illustrative enumerative coding graph of FIG. 4.

FIG. 5 shows enumerative coding graph 500 which is the same as graph 400, but also indicates the path taken by dataword 1001001 (=73 decimal) as the dataword is encoded using the graph. The path is indicated using the bolded branches. The illustrative encoding process begins at state $S_0$ where the dataword (73) is compared to the cardinality of state $S_0$ (96). The dataword is less than this cardinality (73<96) therefore 1 is output as the first bit of the codeword and the encoding proceeds to state $S_1$ via the 1 branch. At state $S_1$, the dataword (73) is compared to the cardinality (56). The dataword is greater than the cardinality (73>=56) therefore 0 is output as the second bit of the codeword, the value of cardinality is subtracted from the dataword (73−56=17), and the encoding proceeds to state $S_3$ via the 0 branch. At state $S_3$, the dataword (17) is compared to the cardinality (28). The dataword is less than this cardinality (17<28) therefore 1 is output as the third bit of the codeword and the encoding proceeds to state $S_5$ via the 1 branch. At state $S_5$, the dataword (17) is compared to the cardinality (14). The dataword is greater than the cardinality (17>=14) therefore 0 is output as the fourth bit of the codeword, the value of cardinality is subtracted from the dataword (17−14=3), and the encoding proceeds to state $S_7$ via the 0 branch. At state $S_7$, the dataword (3) is compared to the cardinality (8). The dataword is less than this cardinality (3<8) therefore 1 is output as the fifth bit of the codeword and the encoding proceeds to state $S_{11}$ via the 1 branch. At state $S_{11}$, the dataword (3) is compared to the cardinality (4). The dataword is less than this cardinality (3<4) therefore 1 is output as the sixth bit of the codeword and the encoding proceeds to state $S_{15}$ via the 1 branch. At state $S_{15}$, the dataword (3) is compared to the cardinality (2). The dataword is greater than the cardinality (3>=2) therefore 0 is output as the seventh bit of the codeword, the value of cardinality is subtracted from the dataword (3−2=1), and the encoding proceeds to state $S_{19}$ via the 0 branch. At state $S_{19}$, the dataword (1) is compared to the cardinality (1). The dataword is equal to the cardinality (1>=1) therefore 0 is output as the eighth and final bit of the codeword. The encoding ends at state $S_{21}$, where all of the states of graph 500 terminate. Putting all of the bits together, the codeword output from this exemplary encoding is 10101100.

Figure 6:
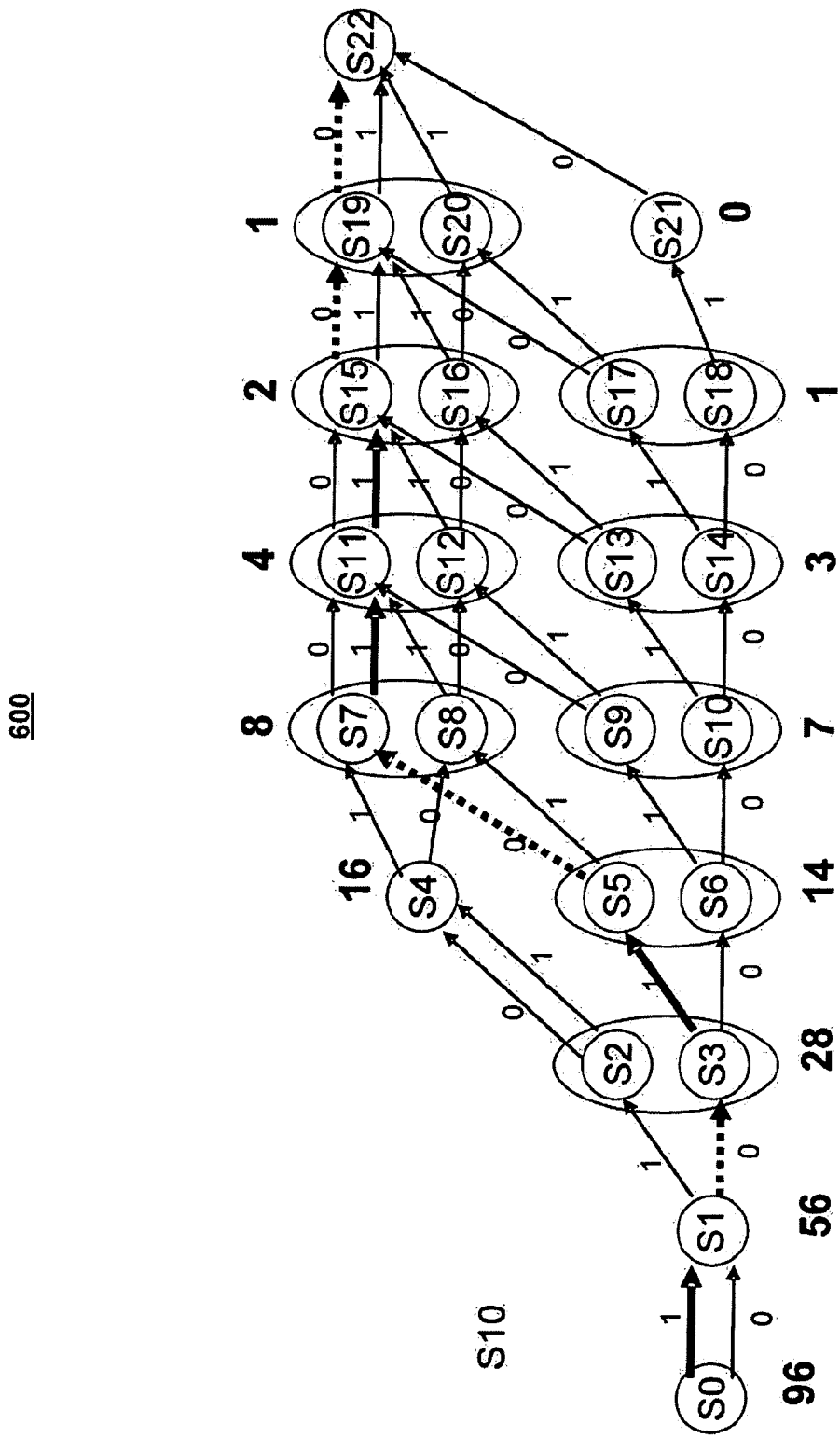
FIG. 6 is another modified version of the illustrative enumerative coding graph of FIGS. 4 and 5.

FIG. 6 shows enumerative coding graph 600 which is the same as graphs 400 and 500, but which also indicates the zero branches through the encoding path using bolded, broken branches. Given a codeword (e.g., 10101100) and an enumerative coding graph (e.g., graph 600), the dataword may be recovered by summing the cardinalities of the states leading to branches along the path with label 0 (i.e., the bolded, broken branches). In the above example, the dataword is equal to: $W(S_1)+W(S_5)+W(S_{15})+W(S_{19})=56+14+2+1=73$.

Enumerative encoding, as described above, relies upon two mathematical operations—comparing and subtracting. In particular, a comparison operation may be performed to compare a dataword with a cardinality and a subtraction operation is performed to subtract cardinality values from the data word. Comparators and adders are well known and relatively simple devices. However, as the number of bits that make up the datawords and cardinalities increases the size of the comparators and adders may also become very large. In some embodiments, reduced bit-width comparators and adders may be used within an enumerative encoder to decrease size, cost, and complexity, of the encoder. In these embodiments, the bit-width of the comparators and the adders may be less than the bit-width of the datawords and cardinalities. One exemplary embodiment is illustrated with reference to FIG. 7.

Figure 7:
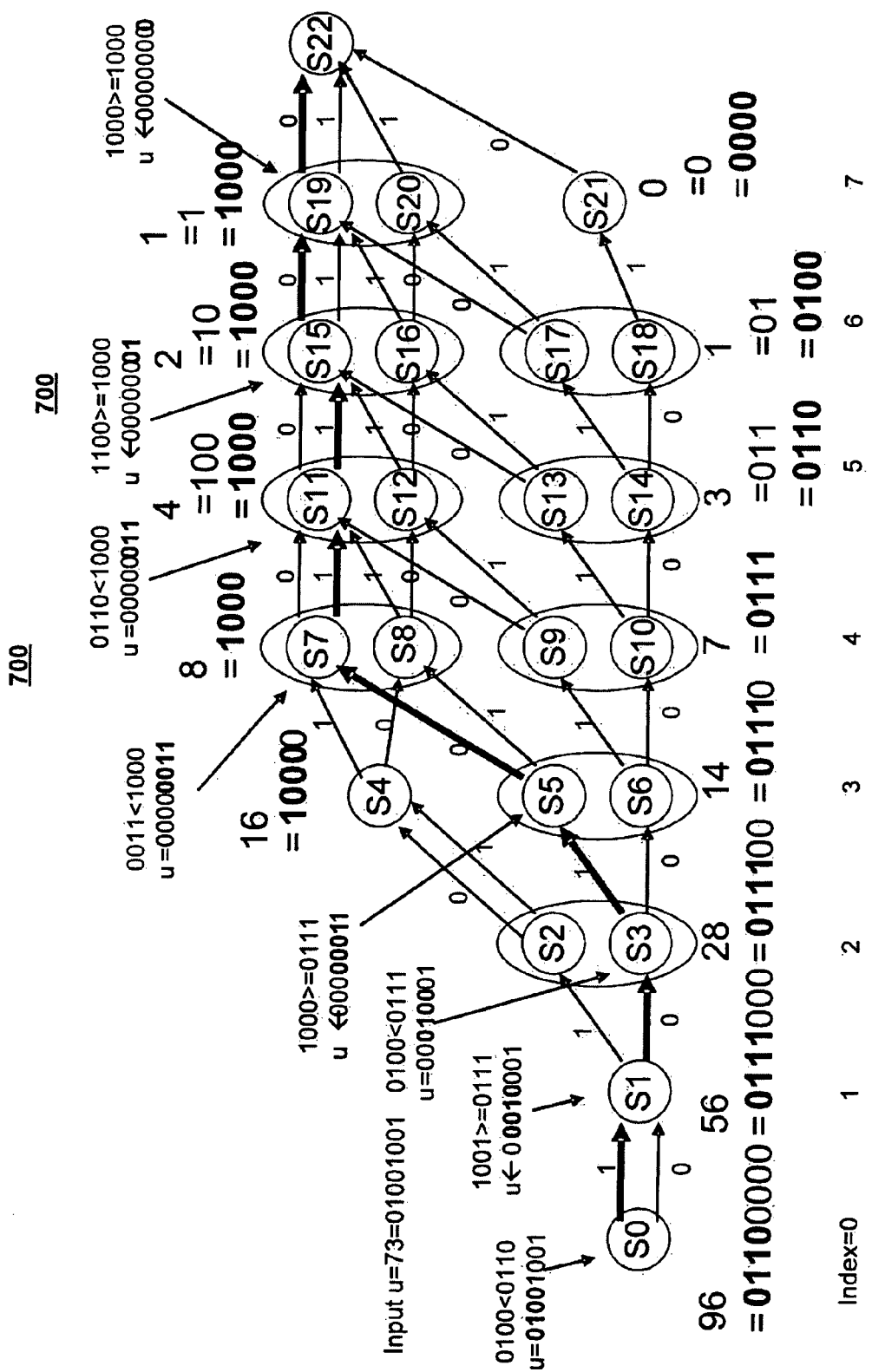
FIG. 7 is another modified version of the illustrative enumerative coding graph of FIGS. 4-6.

FIG. 7 shows enumerative coding graph 700 which is the same as graphs 400, 500, and 600 described above with respect to FIGS. 4-6. Graph 700 illustrates that the same exemplary enumerative encoding operation described above for encoding the 7-bit dataword 1001001 as 8-bit codeword 10101100 may be performed using reduced bit-width comparators and adders. Graph 700 also includes the binary representation of each of the cardinalities and the binary comparisons that are performed at each state.

In order to understand the illustrative example shown in FIG. 7, it useful to define the "span" of a binary number. The span of a binary number can be defined as the difference between the locations of the first one and the last one in the binary number, plus one. For example, 111000 has a span of three, 001001 has a span of four, and 100000 has a span of one. Returning to the example shown in FIG. 7, it can be seen that all of the cardinalities have a span that is three or less. Therefore, even though both the dataword and the cardinalities are both 7-bits long, because none of the cardinalities have a span greater than three bits, 4-bit comparators and adders can be used to perform the required operations. Thus, as will be discussed in greater detail below, selecting cardinalities having reduced spans may permit the use of reduced bit-width comparators and adders. A time index value, which describes the position of the current bit within the codeword, may be used to determine which four bits of the dataword and the cardinalities are provided to the 4-bit comparators and adders. In particular, the most significant bits are selected to be provided to a 4-bit comparator and adder at the beginning of the codeword (time index 0) and at each subsequent time index one less significant bit is provided. These selected four bits are illustrated in graph 700 by the bolded portions of the dataword and cardinalities.

Selecting cardinality values with reduced spans may also reduce the size of the storage needed for the cardinality values. For example, if the spans of all of the cardinality values are not greater than 3, then all of the cardinality values may be stored using only four bits. The true cardinality values may then be obtained from the stored four bits by shifting the stored bits by four minus the time index. Furthermore, three bits may be used to store the cardinality values instead of four bits if the only 4-bit cardinality value 1000 is mapped to an unused another 3-bit value.

Referring now to FIGS. 8-14, various exemplary illustrations and implementations of enumerative coding graphs are shown. As discussed above with respect to FIG. 4, it may be desirable to reduce the number of states within an enumerative coding graph and to group together those states that can share the same cardinality. One approach for constructing an enumerative coding graph is to define each state within the graph in such a way that all of the paths that follow any given state must be the same irrespective of which path leads to that state. In other words, a state should always be able to lead to the same paths. By defining states in this manner, multiple redundant states can be consolidated into a single state without reducing the functionality of the graph. In addition, because the graph is designed to produce a constrained code, those states that would not be within a path of a valid codeword can also be eliminated from the graph.

Where an enumerative coding graph is designed for use with a precoder, the graph may take into account the effect of the precoder on the encoder output. In other words, the graph is constructed in the user domain, but is expected to produce the desired constrained codewords within the NRZ domain.

In one embodiment, where a $$\frac{1}{1+D}$$

precoder is used with an enumerative encoder to produce a constrained code, the states of an enumerative coding graph may be defined based on a pair of terms (x,y). x is set to the minimum of the number of zeros and the number of ones in the codeword in the NRZ domain (i.e., after preceding). For example, the value of x for NRZ codeword 01001001 is equal to the minimum of five and three, which is three. y is set to zero whenever appending a zero to the codeword in the user domain would improve the DC levels of the codeword in the NRZ domain and y is set one otherwise. As explained above, using a $$\frac{1}{1+D}$$

precoder, each a zero in the user domain will result in an NRZ output that is the same as the previous bit. For example, adding a zero in the user domain to NRZ codeword 01001001 would add a one to the end of this codeword (because the last bit is one). Adding the one in the NRZ domain would improve the DC level (i.e., reduce the difference between the number of zeros and one) so y would be set to zero.

Figure 8:
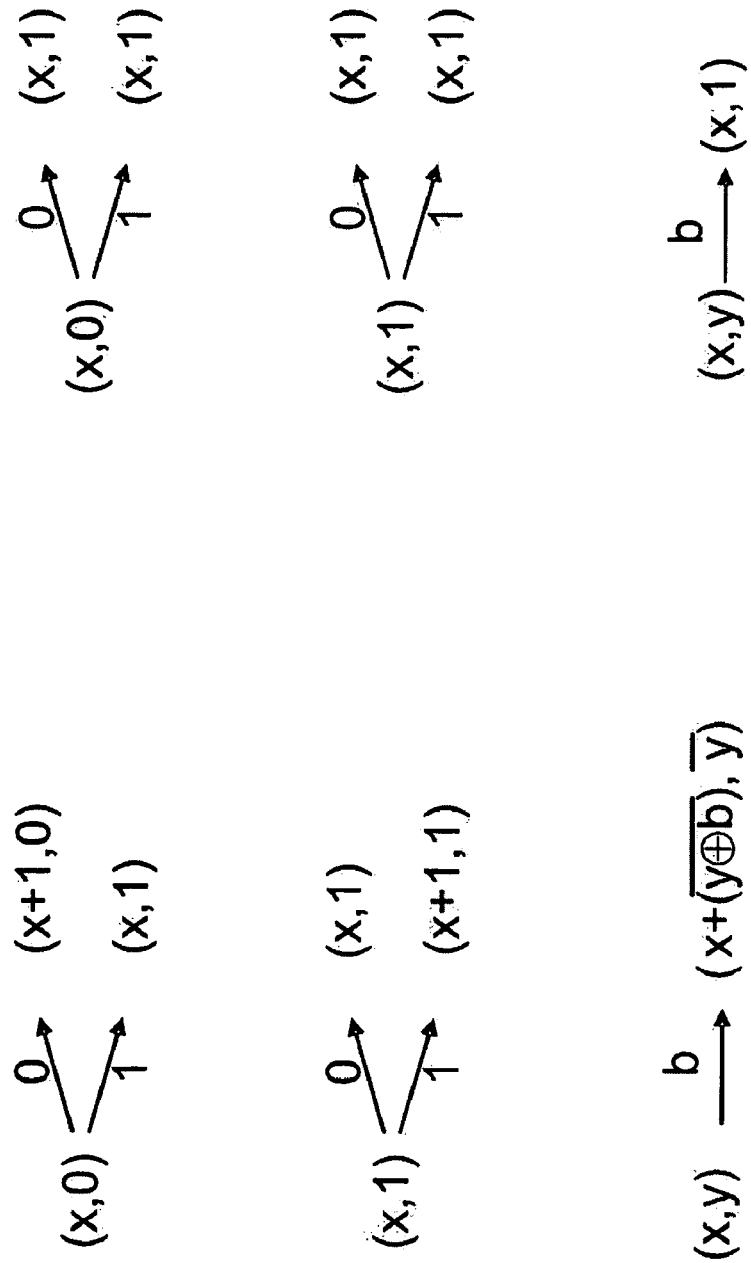
FIG. 8 is a diagram that illustrates the transitions from one state to the next state based on the next codeword bit.

FIG. 8 is a table showing the transitions from any state to the following state using the (x,y) state definition for an enumerative coding graph using a $$\frac{1}{1+D},$$

precoder. The left column of FIG. 8 shows the transitions from state (x,0) and (x,1) based on whether the next codeword bit in the user domain is a zero or a one, whenever the number of zeros in the current state is not equal to the number of ones in the current state. The right column of FIG. 8 shows the transitions from state (x,0) and (x,1) based on whether the next codeword bit in the codeword domain is a zero or a one, whenever the number of zeros in the current state is equal to the number of ones in the current state. The number of zeros in the current state will be equal to the number of ones in the current state whenever x is equal to half of the current time index. A generic logic description of the transition from state (x,y) given the codeword bit b for both of these instances is also shown in FIG. 8.

Figure 9:
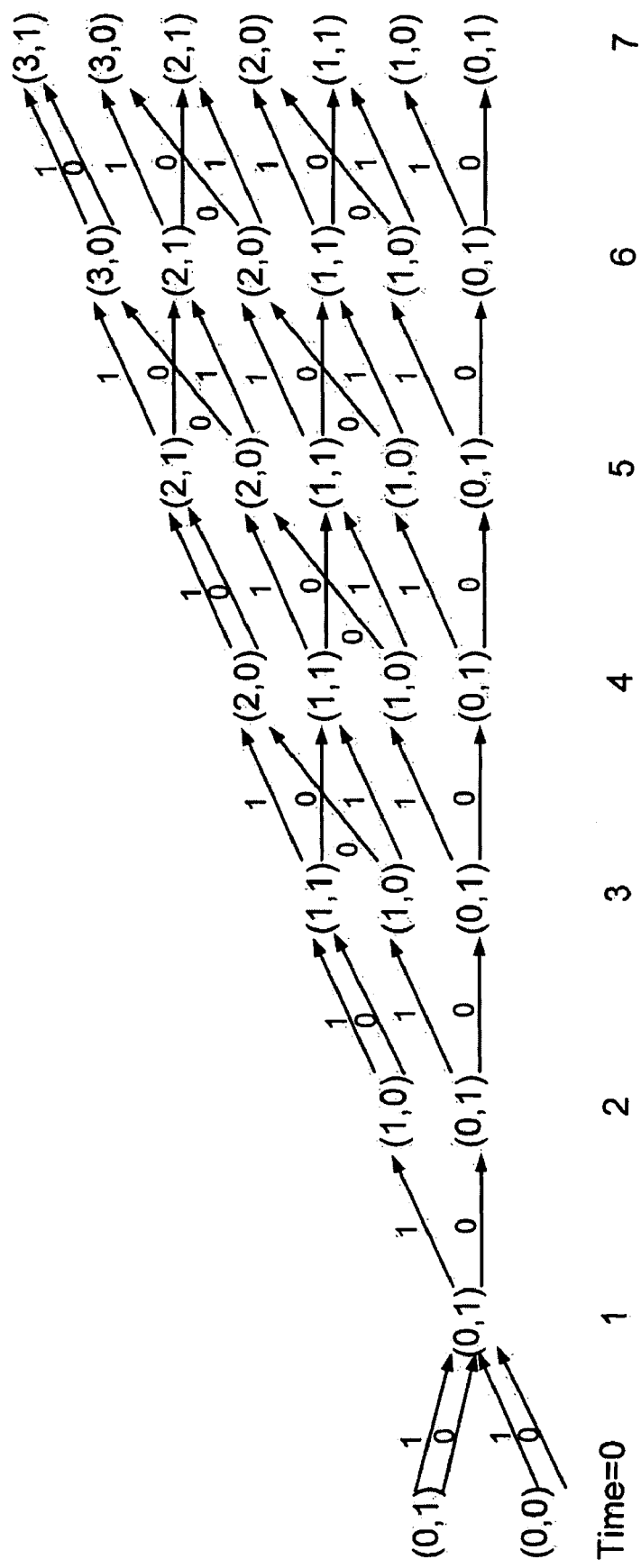
FIGS. 9-11 are illustrative enumerative coding graphs that can be generated based on the state transitions of FIG. 8.
Figure 10:
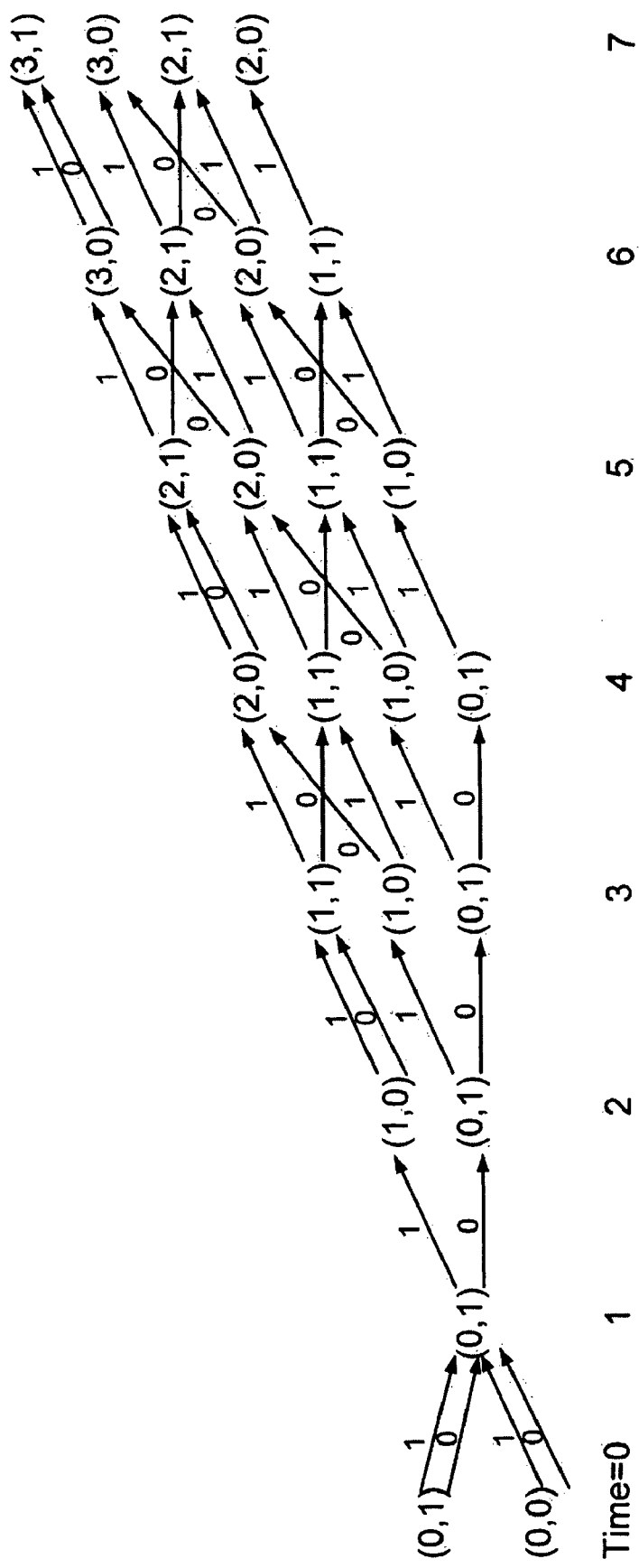
Figure 11:
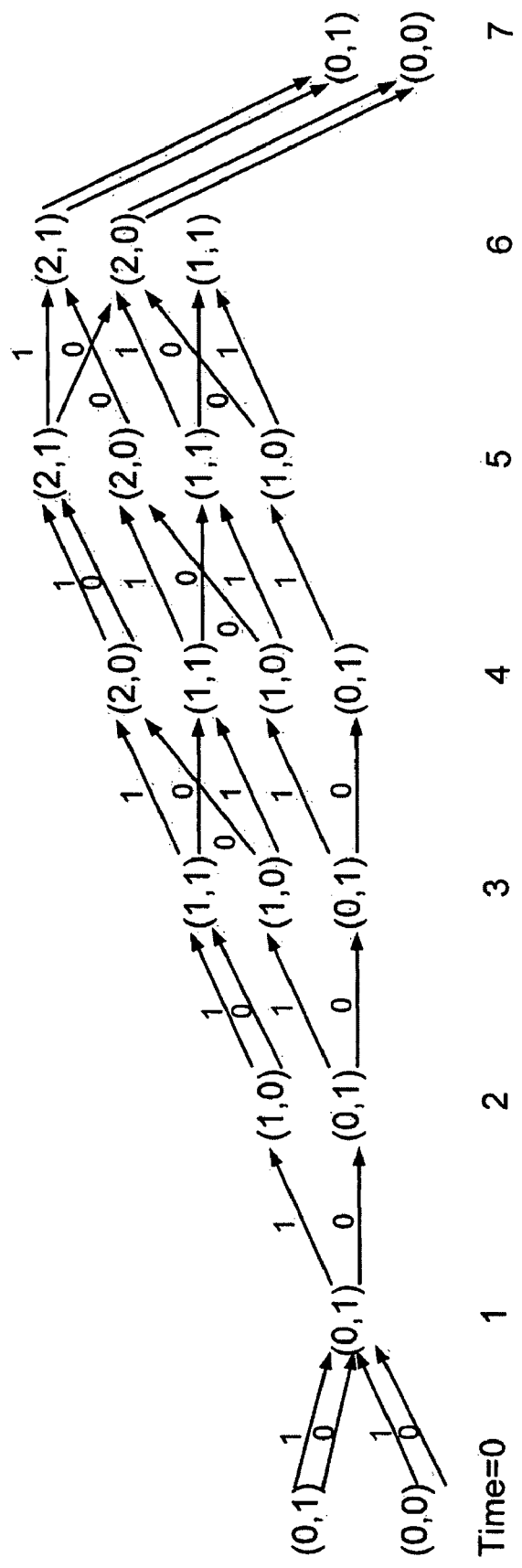

FIGS. 9-11 are illustrative enumerative coding graphs that can be generated using the table of state transitions shown in FIG. 8. FIG. 9 is a complete enumerative coding graph of all of the possible states that can be reached in seven time periods from the beginning of a new codeword. Beginning at time index zero, the graph starts at either state (0,0) or (0,1), (which may be considered equivalent because they both lead to the same next state). Then, depending on the codeword output bits at each subsequent time index, the states transition along one of their respective branches to the next state. Each of the branches represents the next codeword bit in the user domain, while the states themselves represent the status of the codeword in the NRZ domain. If a precoder is not used with the enumerative encoder, this distinction between the user domain and the NRZ domain may be ignored and the calculation of states would be simplified.

In FIG. 10 the enumerative coding graph of FIG. 9 is shown with a number of states removed. These states have been removed because the states violated a DC constraint condition of the enumerative code. The DC constraint used for this example is that the difference between the number of zeros and the number of ones in the 7-bit codeword must be less than three or equivalently that each bit type must be present in the codeword at least two times. Recalling the definition of the first number in each state described above, states (0,1), (1,0), and (1,1) were removed from the last time frame because in these states the difference between the number of zeros and ones is each of these states is greater than three (i.e., x is less than two). All of the states from the previous time frames that necessarily lead to the removed states may also be removed.

Finally, FIG. 11 shows enumerative coding graph of FIG. 10 with redundant states consolidated and the terminal states of the graph merged into states (0,0) and (0,1). As the set of binary sequences that can be generated from a state (x,y) is the same as those of (x',y) where both x and x' are greater than the minimum required value (in this example, two), these states can be merged. This is true because when the value of x is greater than the minimum value required to meet the DC constraint, any subsequent state will also meet that DC constraint. Therefore all of the states where x is equal to three may be merged into the states having x equal to two. Furthermore, in order to be able to concatenate multiple enumerative coding graphs, all of the terminal states of the graphs are merged into the initial states of the next graph. Although not shown in this figure, the first and last set of states may also be merged into just one state, e.g., (0,0). Setting the terminal states equal to the initial states permits a long dataword to be encoded using a series of smaller concatenated graphs instead of one large graph. It can therefore be seen that the resulting enumerative coding graph of FIG. 11 has the same essential structure as the first enumerative coding graph shown in FIG. 4 above.

Where a $$\frac{1}{1+D^2}$$

precoder is used with an enumerative encoder to produce a DC-RLL constrained code, the states of an enumerative coding graph may be defined based on the triplet (x,y,z). In this triplet, x and y may be the same as defined above for the case of the $$\frac{1}{1+D}$$

precoder. z is set to be equal zero if the last two bits of the codeword in the NRZ domain are 00 or 11, otherwise z is set to be equal one. FIG. 12 shows a table showing the transitions from any state (x,y,z) to the following state and FIG. 13 shows an illustrative enumerative coding graph that can be generated using the table of FIG. 12. FIGS. 12 and 13 are equivalent to FIGS. 8 and 11 described above and illustrate how the selection of a precoder (or no precoder) can affect the definition of each state as well as the structure of a graph constructed from those states.

Once an enumerative coding graph is constructed, cardinalities are assigned to each state in the graph. As mention above with respect to FIG. 4, some states within a graph may be grouped to share the same cardinality. This may be useful because fewer cardinalities would be needed for each graph. The cardinality of a state approximately corresponds to the number of allowed binary words that can be generated from that state. Therefore states that can generate a similar number of such words can share the same cardinality. To group states to share the same cardinality, it is helpful to develop an intuitive meaning of cardinality values. As described, during encoding for each state within a graph, a dataword value u is compared with cardinality w. If u is less that w, then the encoder outputs 1 and moves on to next state. This means that this cardinality w is equal to (at most) the number of codewords that begin with 1 and can be generated from this state. If two states s and s' can generate approximately the same number of codewords that begin with 1, they can be assigned the same cardinality. At a given time index, after having 1 as previous output bit, the number of codewords that a state can generate should depends on its DC level. Note that the number of codewords that begin with 1 that can be generated from states sharing a cardinality do not have to be exactly the same. However, as this difference becomes more significant the code will become less efficient because, as will be described below, the smaller value should be selected as the cardinality.

Figure 14A:
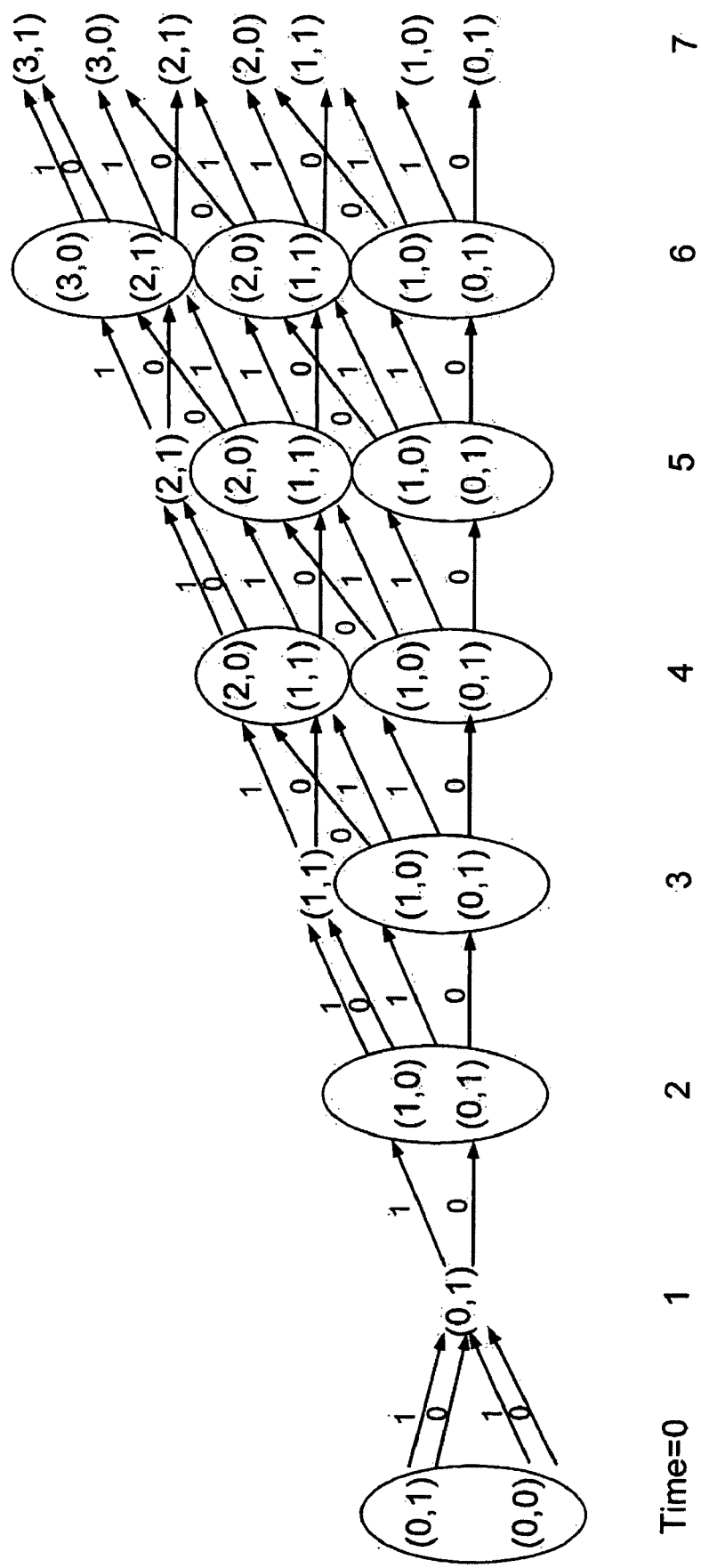

FIG. 14A shows the enumerative coding graph of FIG. 9 with circles added to illustrate the various states that can be grouped together to share cardinalities. For example, it can be seen that all states (1,0) and (0,1) in the graph that follow a 1 branch go to states (1,1) and (1,0) respectively. As discussed, when there is a encoder output of 1, the current value of u will be unchanged. Therefore because these states ((1,0) and (0,1)) lead to other states with the same codeword value, they can share a cardinality.

Figure 14B:
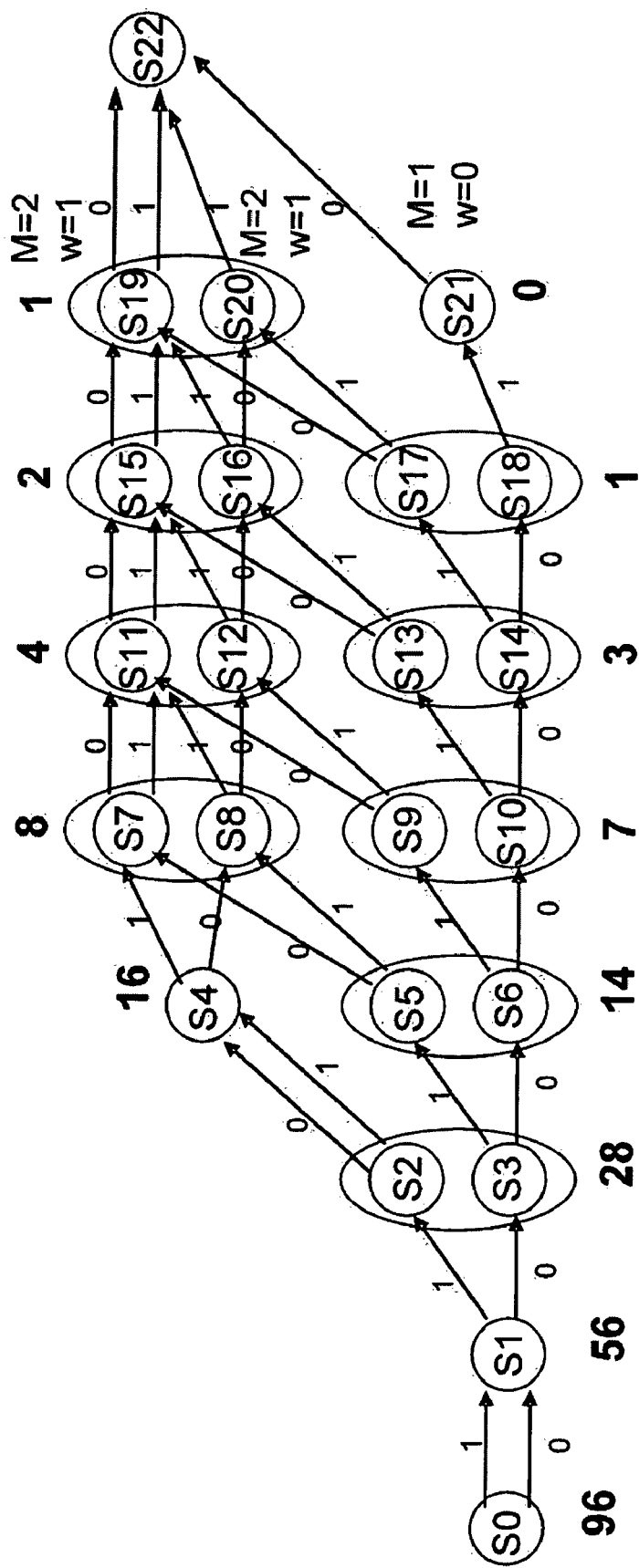

FIG. 14B shows the enumerative coding graph of FIG. 4 that illustrates an exemplary approach for computing cardinality values. A variable, M, used to help compute the cardinalities can be associated with each state in the graph. Recall that the cardinality of a state s relates to the number of words beginning with 1 that can be generated from s. Similarly, the value of M for each state s relates to the total number of words that can be generated from s. The following four steps may be used to compute cardinality w and auxiliary variable M for a given state. First, the values of M and w for the state should not be too large such that subsequent states cannot perform the encoding. Second, the value of M must satisfy a desired run-length profile. Third, the value of w for states in the same group should be the same. Finally, the value of w should have a desired span. Each of these steps are explained in greater detail with reference to the example of FIGS. 14C-14E.

Referring to FIG. 14B, values for M and w can be assigned to the states on the right side of the graph and then be recursively computed from right to left. State 21 has only one outgoing edge with label 0, so it can only generate one word and that word does not begin with 1. Therefore for state 21, M=1 and w=0. State 20 has only one outgoing edge with label 1, so it can only generate one word and that word begins with 1. Therefore for state 20, M=1 and w=1. State 19 can generate an outgoing edge with either 0 or 1, but it can only generate one word that begins with 1. Therefore for state 19, M=2 and w=1.

Figure 14C:
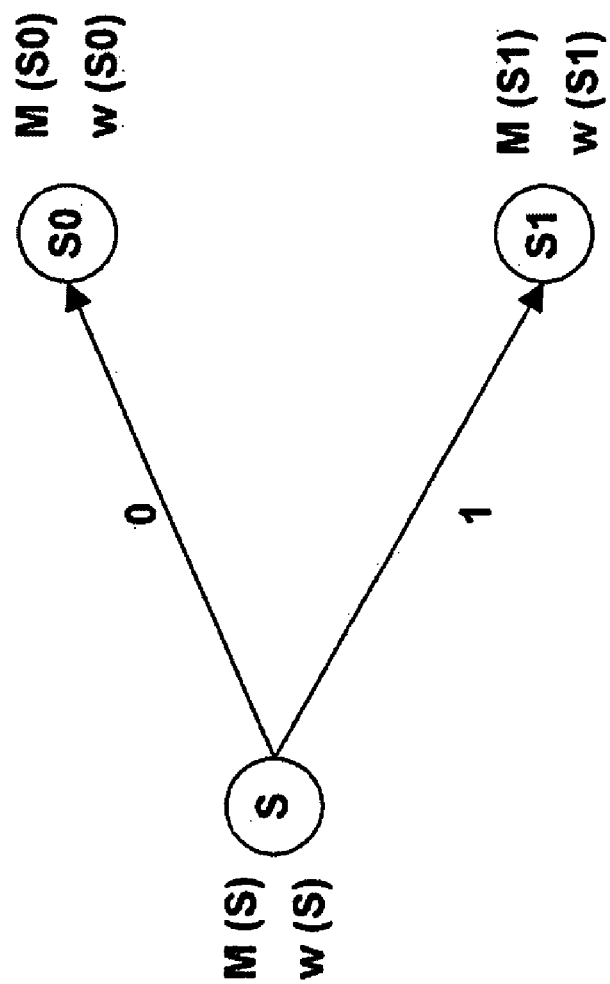

FIG. 14C shows an enumerative coding graph segment in which state s has an edge labeled 0 going to s0 and an edge labeled 1 going to s1. Assuming that M and w have already been computed for states s0 and s1 (i.e., M(s0), w(s0), M(s1), w(s1)), values of M and w need to be computed for state s (i.e., M(s) and w(s)). As a first step, the values of M(s) and w(s) should be assigned such that they are not too large so as to prevent the encoding process to continue from s to s0 or s1. More specifically, any word beginning with 1 will go though s1. Because s1 can generate M(s1) words, w(s) should be less than or equal to M(s1). Moreover, the total number of words that can be generated from s is at most equal to the total number of words that can be generated from both s0 and s1. Therefore, M(s) should be less than or equal to the sum of M(s0) and M(s1).

Figure 14D:
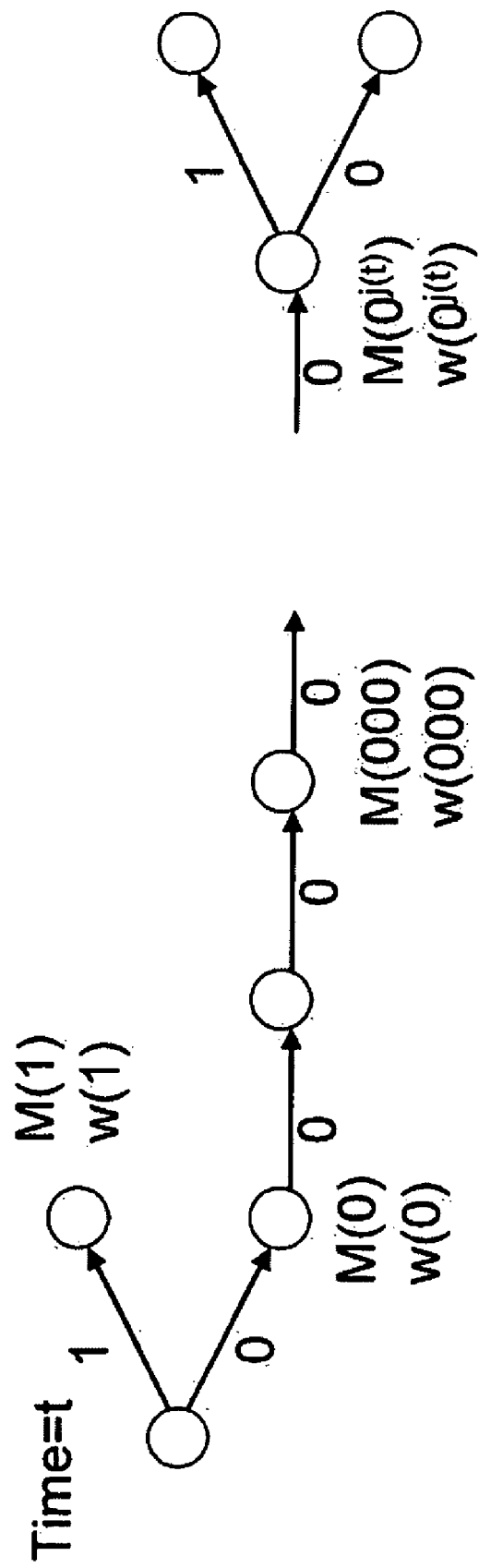

The second step, that M should satisfy the desired run-length profile, is illustrated with respect to FIG. 14D. Suppose a run-length profile at time t is j(t). This means that any word from a state at time t should begin with at most j(t) zeros. In this figure, words should not be permitted to go from state s through the last edge with the label 0 to prevent a run-length violation. Assume u is the input value at state s. According to the encoding procedure, edge 0 is selected whenever u is greater than or equal to w(s) and the input value is updated to be u minus w(s). To go through the edge of the next state with the label 0, u minus w(s) must be greater than or equal to w(0). Repeating this process, the encoder will go through the last edge with label 0 if u is greater than or equal to the sum of w(s), w 0), w(00), . . . , w(0$^{j(t)}$). In order to prevent this from occurring, M(s) should be selected such that M(s) is less than or equal to the sum of w(s), w(0), w(00), . . . , w(0$^{j(t)}$).

The third step for assigning cardinality values, stetting w for states in the same group to same value, can be met by changing previously computed values as follows. Assuming states s and s' are in the same group. If after the first two steps are completed, auxiliary variables and cardinalities of states s and s' can be calculated as M(s), w(s), M(s'), and w(s'). If w(s) is greater then w(s'), then w(s) should be changed to be equal to the value of w(s'). M(s) should also be reduced by the difference between the values of w(s) and w(s'). This modification reduces the number of words that can be generated from state s.

The final step in assigning cardinality values is to reduce the cardinalities, if necessary, to have the desired span. For example, given a maximum span of 4 and a computed cardinality value of 93 (101101), the cardinality can be rounded down to 88 (1011000) to reduce the span. The auxiliary variable M for this state would have to be reduce by the same amount (i.e., 5). However, because the auxiliary variables M are not used in the actual encoding and decoding, their spans do not need to be reduced.

Figure 14E:
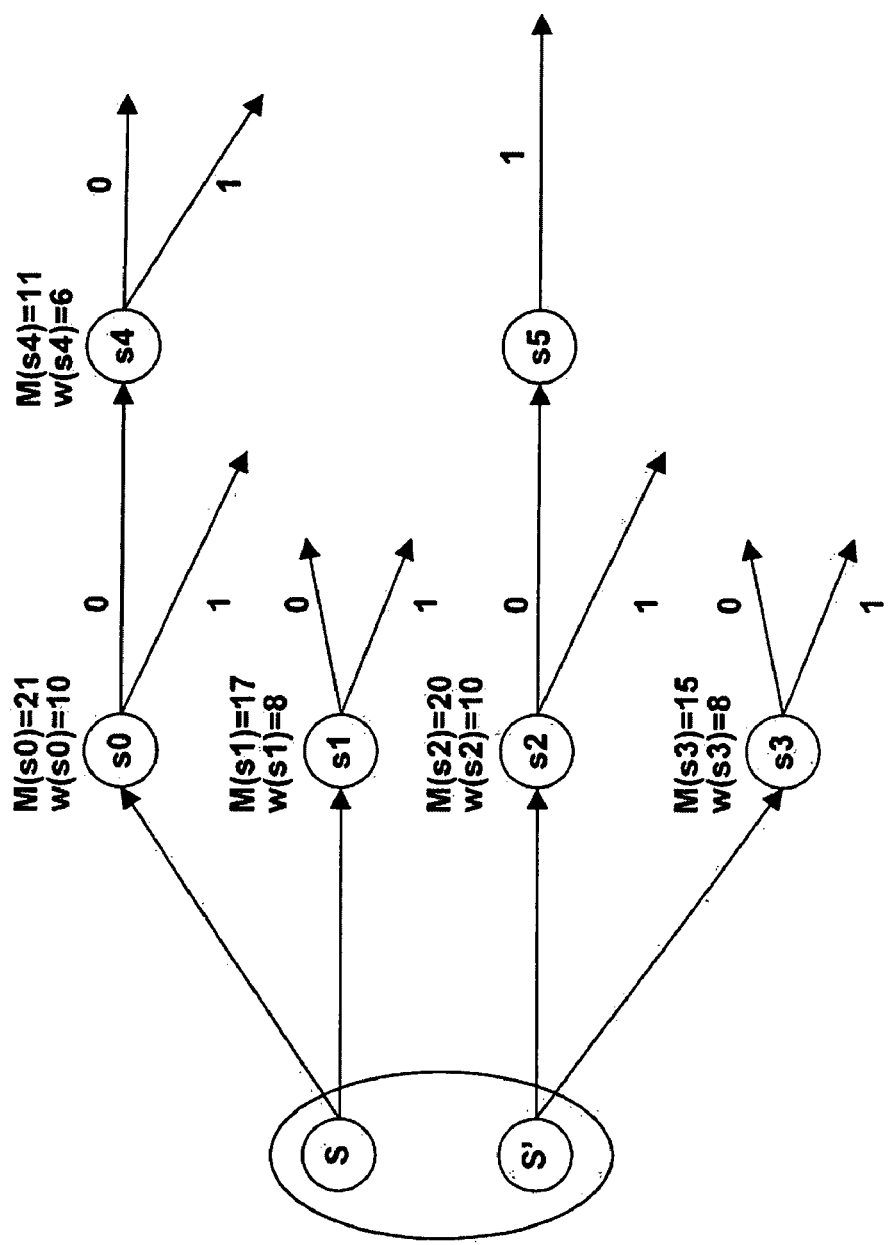

FIG. 14E shows a partial enumerative coding graph that can be used as an example for assigning cardinalities in accordance with the criteria discussed above. In this example M and w will be computed for states s and s', which are in the same group. M and w of states s0 through s5 are already computed. The run-length profile for states s and s' is 2 and the maximum cardinality span is 3. First M(s) should be at most 38, the sum of M(s0) and M(s1) (i.e., 21+17), and w(s) should be at most 17, the value of M(s1). Similarly, M(s') should be at most 35, the sum of M(s2) and M(s3) (i.e., 20+15), and w(s') should be at most 15, the value of M(s3). Second, because the run-length profile is 2, a word beginning with 000 should not be permitted from s. Therefore, M(s) should be less than or equal to 33, the sum of w(s), w(s0), and w(s4) (i.e., 17+10+6). If this value was greater than 38, M(s) would be kept as 38. M(s') does not need to be adjusted because it cannot generate a word in violation of the run-length limit. Next, because M(s)=33, w(s)=17, M(s')=35, w(s')=15, w(s) is reduced by 2 to 15 and M(s) is reduced by 2 to 31 to set the cardinalities to the same values for s and s'. Finally, in order to reduce the spans of the cardinalities to 3 from 4 (15=1111), the cardinalities of and s' are reduced to 14 (1110). Both M(s) and M(s') are also reduced by 1 to 30 and 34, respectively.

FIG. 16 shows a more detailed block diagram of an encoder 1600 that may be used to generate an enumerative constrained code in accordance with some embodiments of the present invention. Encoder receives a 191-bit dataword and outputs a 192-bit codeword. The primary elements of encoder 1600 are dual 96-bit enumerative encoders 1625 and precoder 1650. Enumerative encoders 1625 receive datawords and use an enumerative coding graph, as described above, to produce a constrained codeword in the user domain. The user domain codeword may be converted to the NRZ domain by precoder 1650 to complete the encoding process. In some embodiments, an enumerative encoder may be provided that can encode an entire dataword. However, in some other embodiments, where the datawords are longer than the input capacity of the enumerative encoder, the datawords may be split up into two or more portions that are separately encoded, in parallel. Even though it may be possible to produce an enumerative encoder that can handle long datawords and would not require the datawords to be split, it may be desirable to use multiple enumerative encoders that are smaller and more efficient than a single large encoder.

In the illustrated embodiment of FIG. 16, the 191-bit input dataword 1601 is split into two 96-bit dataword portions 1620. Each of the 96-bit dataword portions 1620 is encoded by one of the enumerative encoders 1625. Enumerative encoders 1625 may each use a signal 96-bit enumerative coding graph (not show) to encode dataword portions 1620. Alternatively, enumerative encoders 1625 may each use a series of smaller enumerative coding graphs (not show) that are concatenated together to form a single 96-bit enumerative coding graph.

In order to split 191-bit dataword 1601 into two dataword portions 1620, the 191-dataword is first split into a 3-bit section and a 188-bit section. The 3-bit section is mapped into four bits by 3-to-4 bit mapping block 1610. FIG. 15 is a table showing an illustrative 3-to-4 bit mapping. Then half of the bits output from block 1610 and half of the 188-bits are provided to enumerative encoders 1625 as dataword portions 1620. There are two reasons for performing this 3-to-4 bit mapping. First, this mapping allows the odd 191-bit dataword input to be split into two equal portions. Second, and more importantly, this mapping may ensure that neither dataword portion 1620 begins with the bits 11. As previously discussed, enumerative encoders typically have a limit on how large a dataword input can be. If a dataword input is larger than this limit, the output of the encoder will not be decodable. By preventing any dataword beginning with the bits 11 from being provided to the enumerative encoder, this mapping reduces the maximum size of the input to the encoder. Thus, the encoder must only be designed to accept numbers equal to or less than 1011 . . . 1. After dataword portions 1620 are encoded the datawords portions are combined together into one 192-bit codeword in the user domain. In some embodiments, rather than combining the two datawords portions as shown in the present embodiment, an interleaver is provided to interleave the datawords portions together into a single codeword. One benefit of using an interleaver to generate the user domain codeword is that the interleaver may be configured to ensure that an interleaved RLL constraint is met by the encoder. The user domain codeword is provided to precoder 1650. Precoder 1650 may be any suitable precoder such as, for example, a $$\frac{1}{1+D}$$

precoder or a $$\frac{1}{1+D^2}$$

precoder. The output of the precoder is NRZ domain codeword 1602.

As shown, encoder 1600 performs the enumerative encoding of the dataword input in parallel. However, as described above, the enumerative encoding process sometimes uses information about previous codeword bits when encoding a dataword. For example, the enumerative coding graph used in connection with the $$\frac{1}{1+D^2}$$

precoder used a (x,y,z) triplet to define each state. The z portion of this triplet is defined based on the previous two bits of the codeword in the NRZ domain, namely whether the bits are 01/10 or 00/11. Thus, when splitting a dataword into multiple dataword portions it may not be possible to begin encoding a second portion until the encoding of the first portion is complete and the last bits of the codeword are provided. While this issue may present a challenge when using certain precoders such as a $$\frac{1}{1+D^2}$$

precoder, this issue does not arise with other precoders such as a $$\frac{1}{1+D}$$

precoder. This issue would not arise with a $$\frac{1}{1+D}$$

precoder because as seen in FIG. 9, the first state within the enumerative coding chart does not depend on previous bits.

One solution that may permit parallel encoding for encoding schemes that depend on previous bits is to start the encoding from a known state and then to alter the resulting codeword based on the previous codeword, should that be necessary. Returning to the $$\frac{1}{1+D^2}$$

precoder example, the enumerative encoder may be configured to always start from state (0,0,1), which corresponds to previous NRZ bits 01 or 10. Then, if it turns out that the final NRZ bits of the previous codeword are actually 00 or 11 (in which case the encoder should have started at state (0,0,0)), these bits should be treated as 10 or 01, respectively, by the precoder to prevent an encoding error. This may be accomplished by sending either 10 or 01 to the precoder in place of the actual last bits of the first codeword. Equivalently, the same result may be achieved by flipping the first bit of the second codeword before the first bit is sent to the precoder with the actual last bits of the previous codeword. Subsequently, a decoder may reverse this change prior to decoding this codeword. Thus, whenever the last two bits of a previously received codeword are 00 or 11, the postcoder and then the decoder would treat the last two bits as 10 or 01, respectively.

One issue that may arise from flipping bits during the encoding is that performing this operation may result in a run-length constraint violation. For example, if a first code word ends with the bits 111000 and the second would have codeword started with the bits 100001, flipping the first bit in the second codeword to make the codeword begin with 000001 would result in a combined codeword having eight consecutive zeros. This issue may be resolved by modifying the run-length profile imposed by the enumerative encoder to make the constraint more strict at the beginning of the codeword. For example, the profile 5, 9, 9, 9, 9, 9 . . . may be replaced with 5, 4, 9, 9, 9, 9 . . . .

FIG. 17 shows a detailed block diagram of a decoder 1700 that may be used to decode an enumerative DC-RLL constrained code in accordance with some embodiments of the present invention. Decoder 1700 may be configured to decode the output of encoder 1600, however it should be understood that decoder 1700 may also be configured to decode the output of any other suitable encoder. Decoder 1700 receives 192-bit NRZ domain codeword 1702. Postcoder 1750, which can decode the coding performed by a precoder such as precoder 1650 (FIG. 16), converts 192-bit NRZ domain codeword 1702 into a user domain codeword. This user domain codeword may then be split into two 96-bit portions which are provided to enumerative decoders 725. The user domain codeword may be split in half as shown in the figure or may be split in any other suitable way such as by de-interleaving. Decoder 1700 may be configured to split the codeword based on the way the codeword was combined by the encoder. Enumerative decoders 1725 decode the codeword portions into 96-bit dataword portions that can be recombined into 191-bit dataword 1701 using 4-to-3 bit mapping block 1710.

Figure 18:
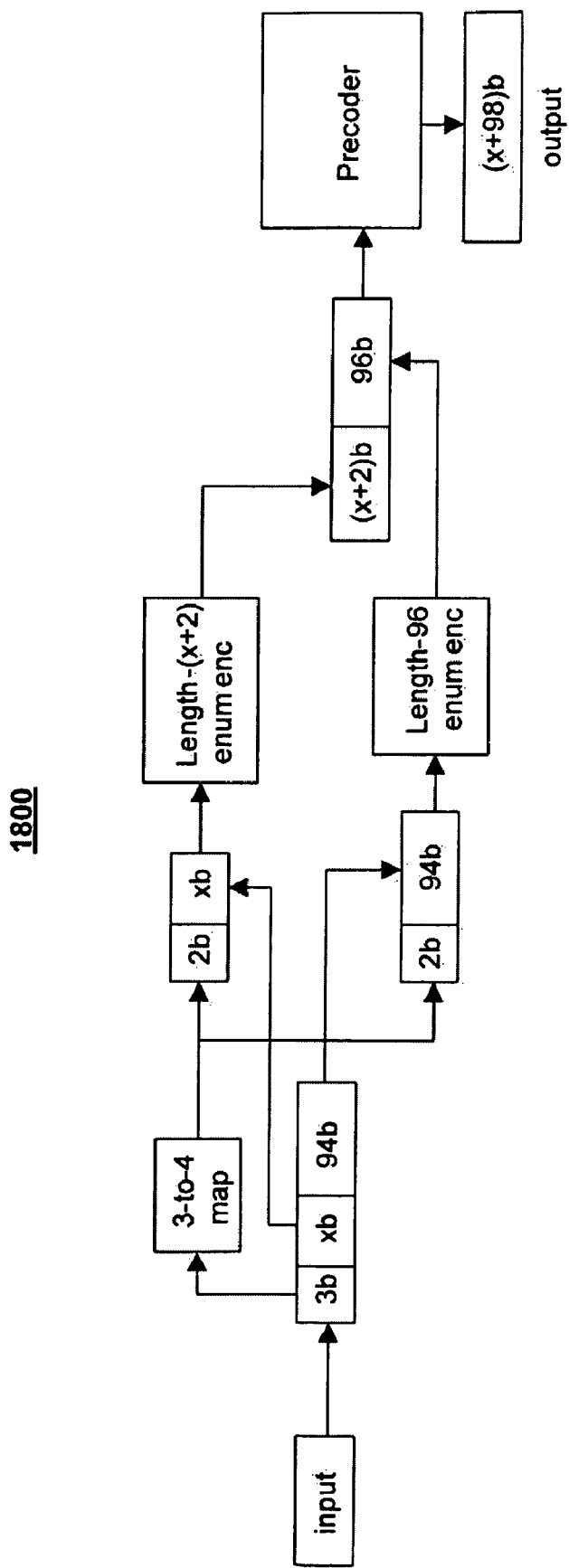
Figure 19:
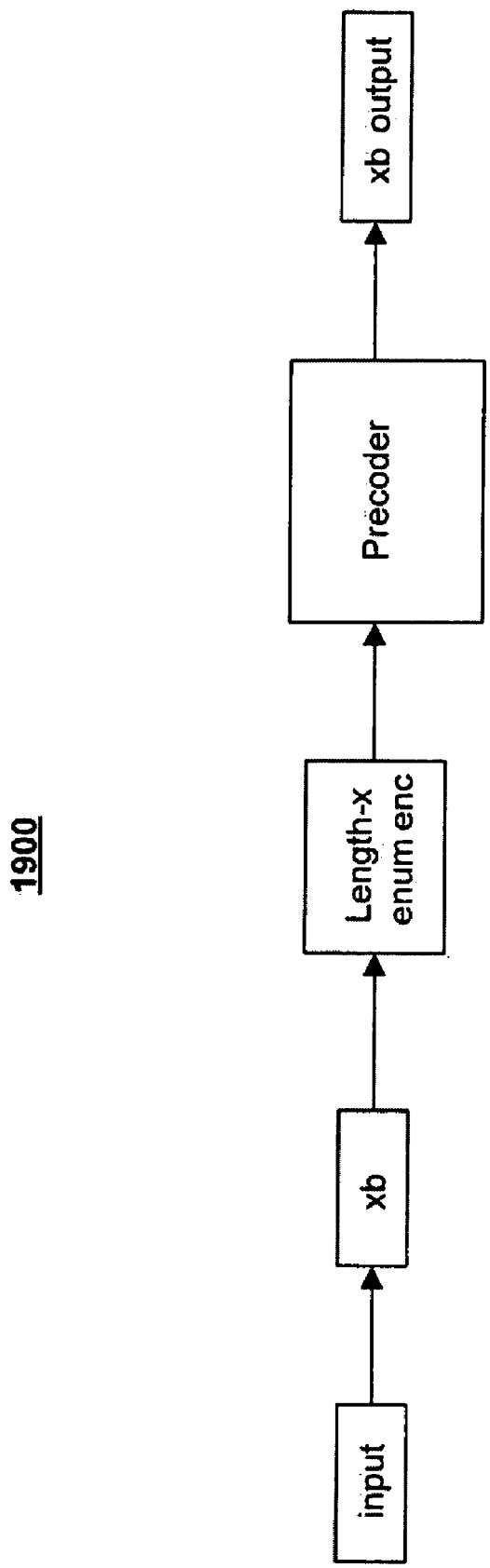
Figure 20:
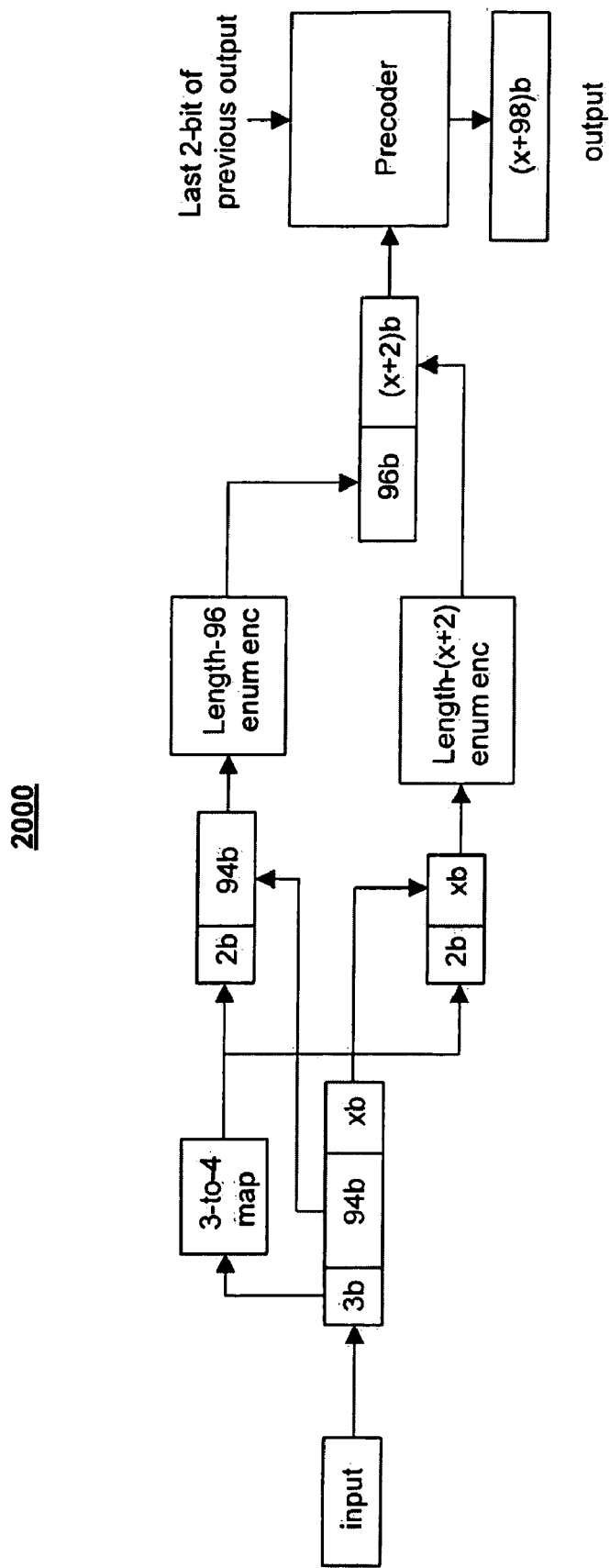
Figure 21:
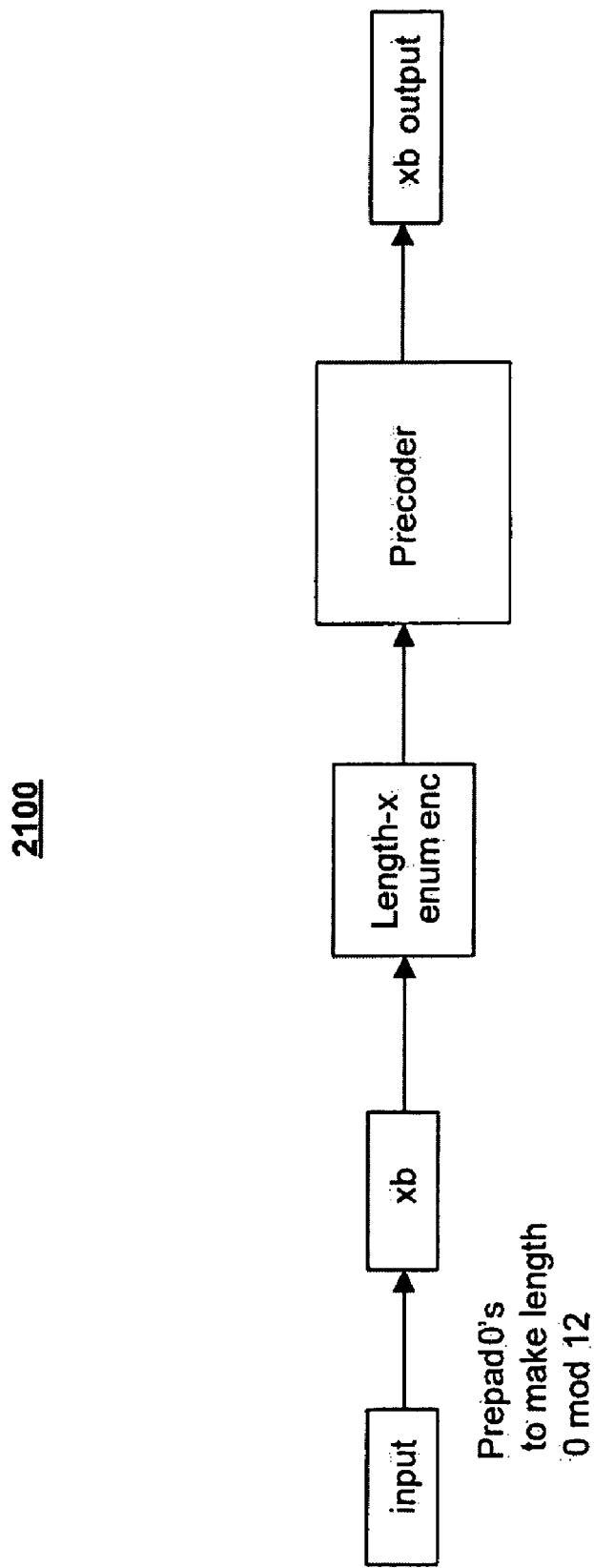

FIGS. 16 and 17 illustrate an encoder and decoder that may be used with an enumerative constrained code in accordance with some embodiments of the present invention. The code rate in these illustrative embodiments is 191/192. 191-bit datawords are encoded into 192-bit codewords. Whenever datawords are provided to this encoder that are not a multiple of 191, the partial codeword must be processed in a way that will allow this partial codeword to be successfully decoded. FIGS. 18-21 show illustrative encoder configurations for encoding these partial codewords. A partial codeword may be place either at the beginning of a sector or at the end of a sector. FIGS. 18 and 19 show illustrative encoders for encoding partial codewords at the beginning of a sector and FIGS. 20 and 21 show illustrative encoders for encoding partial codewords at the end of a sector.

FIG. 18 shows a block diagram of an illustrative encoder 1800 that is configured to receive a partial dataword at the beginning of a sector. Encoder 1800 operates in a similar manner as encoder 1600, except the encoder 1800 is configured to receive an input dataword that is less than 191 bits and greater than 96 bits. All of the elements of encoder 1800 operate in a similar manner to the elements of encoder 1600, except where noted. Input dataword is divided into a first partial dataword portion that is x plus 2 bits long, where x is the number of bits by which this partial codeword exceeds 96 bits, and a second full dataword portion. Then the two dataword portions are each encoded by enumerative encoders 1825 and 1826. Enumerative encoder 1825 may be a full 96-bit enumerative encoder that is being used to encode a dataword portion that is less than 96 bits. In order for the encoding of this portion to be successful, the enumerative encoder 1825 may start encoding this portion from a state in the middle of the enumerative coding chart. A starting state may be selected at a time stage in the chart such that the portion will finish at the last stage of the chart. This may allow the transition to the next codeword to be seamless. Furthermore, the state having the largest cardinality at the selected time stage may be selected to ensure that a large number can be encoded. Finally, the encoded user domain codewords generated by the enumerative encoders are combined, processed by a precoder, and output as a single NRZ domain codeword.

FIG. 19 shows encoder 1900 that operates in the same manner as encoder 1800, except that encoder 1900 is provided with a partial dataword that is less than 96 bits in length. Thus, no splitting and combining of the data is necessary. It should be understood that illustrated encoder 1900, 1800, and 1600 (as well as encoders 2000 and 2100 discussed below) may be implemented using the same encoder circuitry and that is configurable to encode data in the various ways described based on the data input to the encoder circuitry or based on configuration settings.

FIG. 20 shows a block diagram of an illustrative encoder 2000 that is configured to receive a partial dataword at the end of a data sector. Encoder 2000 operates in a similar manner as encoder 1800, except that in the illustrative embodiment shown in FIG. 20 the input dataword is divided such that the partial dataword portion is taken from the end of the dataword. Furthermore, the partial dataword portion may be encoded using the initial stages of enumerative coding chart so that the transition from the previous full dataword portion to the partial dataword portion is seamless. FIG. 21 shows encoder 2100 that operates in the same manner as encoder 2000, except that encoder 2100 is provided with a partial dataword that is less than 96 bits in length. Thus, no splitting and combining of the data is necessary.

When a partial codeword is placed at the end of a sector as illustrated in FIGS. 20 and 21, the decoder may need to adjust its operation to compensate for the instances when the partial codeword ends in the middle of the graph. FIG. 22 illustrates the operation of a decoder when decoding a partial codeword placed at the end of a sector. As described above with respect to FIG. 7, a cardinality with a reduced span may be stored with fewer bits than would be ordinarily be required for a number of that size. When accessed, the stored bits for the cardinality are shifted by an appropriate number of bits based on the time stage of the operation. In FIG. 22, nine bits are stored for each cardinality value and each subsequent cardinality value is shifted left an additional bit. If the decoded codeword terminates in the middle of the graph, then in some instances leftover bits of the cardinalities may not be added to the decoded data because they have not been shifted into range. Thus, if there are any leftover bits in the final cardinality value added to the decoded dataword that are equal to one, one should be added to the decoded dataword.

Referring now to FIGS. 23A-23G, various exemplary implementations of the present invention are shown.

Referring now to FIG. 23A, the present invention can be implemented in a hard disk drive (HDD) 2300. The present invention may implement either or both signal processing and/or control circuits, which are generally identified in FIG. 23A at 2302. In some implementations, the signal processing and/or control circuit 2302 and/or other circuits (not shown) in the HDD 2300 may process data, perform coding and/or encryption, perform calculations, and/or format data that is output to and/or received from a magnetic storage medium 2306.

The HDD 2300 may communicate with a host device (not shown) such as a computer, mobile computing devices such as personal digital assistants, cellular phones, media or MP3 players and the like, and/or other devices via one or more wired or wireless communication links 2308. The HDD 2300 may be connected to memory 2309 such as random access memory (RAM), low latency nonvolatile memory such as flash memory, read only memory (ROM) and/or other suitable electronic data storage.

Referring now to FIG. 23B, the present invention can be implemented in a digital versatile disc (DVD) drive 2310. The present invention may implement either or both signal processing and/or control circuits, which are generally identified in FIG. 23B at 2312, and/or mass data storage of the DVD drive 2310. The signal processing and/or control circuit 2312 and/or other circuits (not shown) in the DVD drive 2310 may process data, perform coding and/or encryption, perform calculations, and/or format data that is read from and/or data written to an optical storage medium 2316. In some implementations, the signal processing and/or control circuit 2312 and/or other circuits (not shown) in the DVD drive 2310 can also perform other functions such as encoding and/or decoding and/or any other signal processing functions associated with a DVD drive.

The DVD drive 2310 may communicate with an output device (not shown) such as a computer, television or other device via one or more wired or wireless communication links 2317. The DVD drive 2310 may communicate with mass data storage 2318 that stores data in a nonvolatile manner. The mass data storage 2318 may include a hard disk drive (HDD). The HDD may have the configuration shown in FIG. 23A. The HDD may be a mini HDD that includes one or more platters having a diameter that is smaller than approximately 1.8". The DVD drive 2310 may be connected to memory 2319 such as RAM, ROM, low latency nonvolatile memory such as flash memory and/or other suitable electronic data storage.

Referring now to FIG. 23C, the present invention can be implemented in a high definition television (HDTV) 2320. The present invention may implement either or both signal processing and/or control circuits, which are generally identified in FIG. 23C at 2322, a WLAN interface and/or mass data storage of the HDTV 2320. The HDTV 2320 receives HDTV input signals in either a wired or wireless format and generates HDTV output signals for a display 2326. In some implementations, signal processing circuit and/or control circuit 2322 and/or other circuits (not shown) of the HDTV 2320 may process data, perform coding and/or encryption, perform calculations, format data and/or perform any other type of HDTV processing that may be required.

The HDTV 2320 may communicate with mass data storage 2327 that stores data in a nonvolatile manner such as optical and/or magnetic storage devices, for example, hard disk drives and/or DVD drives. At least one HDD may have the configuration shown in FIG. 23A and/or at least one DVD drive may have the configuration shown in FIG. 23B. The HDD may be a mini HDD that includes one or more platters having a diameter that is smaller than approximately 1.8". The HDTV 2320 may be connected to memory 2328 such as RAM, ROM, low latency nonvolatile memory such as flash memory and/or other suitable electronic data storage. The HDTV 2320 also may support connections with a WLAN via a WLAN interface 2329.

Referring now to FIG. 23D, the present invention implements a control system of a vehicle 2330, a WLAN interface and/or mass data storage of the vehicle 2330. In some implementations, the present invention may implement a powertrain control system 2332 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in other control systems 2340 of the vehicle 2330. The control system 2340 may likewise receive signals from input sensors 2342 and/or output control signals to one or more output devices 2344. In some implementations, the control system 2340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 2332 may communicate with mass data storage 2346 that stores data in a nonvolatile manner. The mass data storage 2346 may include optical and/or magnetic storage devices for example hard disk drives and/or DVD drives. At least one HDD may have the configuration shown in FIG. 23A and/or at least one DVD drive may have the configuration shown in FIG. 23B. The HDD may be a mini HDD that includes one or more platters having a diameter that is smaller than approximately 1.8". The powertrain control system 2332 may be connected to memory 2347 such as RAM, ROM, low latency nonvolatile memory such as flash memory and/or other suitable electronic data storage. The powertrain control system 2332 also may support connections with a WLAN via a WLAN interface 2348. The control system 2340 may also include mass data storage, memory and/or a WLAN interface (all not shown).

Referring now to FIG. 23E, the present invention can be implemented in a cellular phone 2350 that may include a cellular antenna 2351. The present invention may implement either or both signal processing and/or control circuits, which are generally identified in FIG. 23E at 2352, a WLAN interface and/or mass data storage of the cellular phone 2350. In some implementations, the cellular phone 2350 includes a microphone 2356, an audio output 2358 such as a speaker and/or audio output jack, a display 2360 and/or an input device 2362 such as a keypad, pointing device, voice actuation and/or other input device. The signal processing and/or control circuits 2352 and/or other circuits (not shown) in the cellular phone 2350 may process data, perform coding and/or encryption, perform calculations, format data and/or perform other cellular phone functions.

The cellular phone 2350 may communicate with mass data storage 2364 that stores data in a nonvolatile manner such as optical and/or magnetic storage devices, for example, hard disk drives and/or DVD drives. At least one HDD may have the configuration shown in FIG. 23A and/or at least one DVD drive may have the configuration shown in FIG. 23B. The HDD may be a mini HDD that includes one or more platters having a diameter that is smaller than approximately 1.8". The cellular phone 2350 may be connected to memory 2366 such as RAM, ROM, low latency nonvolatile memory such as flash memory and/or other suitable electronic data storage. The cellular phone 2350 also may support connections with a WLAN via a WLAN interface 2368.

Referring now to FIG. 23F, the present invention can be implemented in a set top box 2380. The present invention may implement either or both signal processing and/or control circuits, which are generally identified in FIG. 23F at 2384, a WLAN interface and/or mass data storage of the set top box 2380. The set top box 2380 receives signals from a source such as a broadband source and outputs standard and/or high definition audio/video signals suitable for a display 2388 such as a television and/or monitor and/or other video and/or audio output devices. The signal processing and/or control circuits 2384 and/or other circuits (not shown) of the set top box 2380 may process data, perform coding and/or encryption, perform calculations, format data and/or perform any other set top box function.

The set top box 2380 may communicate with mass data storage 2390 that stores data in a nonvolatile manner. The mass data storage 2390 may include optical and/or magnetic storage devices, for example, hard disk drives and/or DVD drives. At least one HDD may have the configuration shown in FIG. 23A and/or at least one DVD drive may have the configuration shown in FIG. 23B. The HDD may be a mini HDD that includes one or more platters having a diameter that is smaller than approximately 1.8". The set top box 2380 may be connected to memory 2394 such as RAM, ROM, low latency nonvolatile memory such as flash memory and/or other suitable electronic data storage. The set top box 2380 also may support connections with a WLAN via a WLAN interface 2396.

Referring now to FIG. 23G, the present invention can be implemented in a media player 2460. The present invention may implement either or both signal processing and/or control circuits, which are generally identified in FIG. 23G at 2404, a WLAN interface and/or mass data storage of the media player 2400. In some implementations, the media player 2400 includes a display 2407 and/or a user input 2408 such as a keypad, touchpad and the like. In some implementations, the media player 2400 may employ a graphical user interface (GUI) that typically employs menus, drop down menus, icons and/or a point-and-click interface via the display 2407 and/or user input 2408. The media player 2400 further includes an audio output 2409 such as a speaker and/or audio output jack. The signal processing and/or control circuits 2404 and/or other circuits (not shown) of the media player 2400 may process data, perform coding and/or encryption, perform calculations, format data and/or perform any other media player function.

The media player 2400 may communicate with mass data storage 2410 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example, hard disk drives and/or DVD drives. At least one HDD may have the configuration shown in FIG. 23A and/or at least one DVD drive may have the configuration shown in FIG. 23B. The HDD may be a mini HDD that includes one or more platters having a diameter that is smaller than approximately 1.8". The media player 2400 may be connected to memory 2414 such as RAM, ROM, low latency nonvolatile memory such as flash memory and/or other suitable electronic data storage. The media player 2400 also may support connections with a WLAN via a WLAN interface 2416. Still other implementations in addition to those described above are contemplated.

The above described embodiments of the present invention are presented for the purposes of illustration and not of limitation. Since many embodiments of the invention can be made without departing from the spirit and scope of the invention, the invention resides in the claims hereinafter appended. Furthermore, the present invention is not limited to a particular implementation. For example, one or more steps of methods described above may be performed in a different order or concurrently and still achieve desirable results. The invention may be implemented in hardware, such as on an application specific integrated circuit (ASIC) or on a field-programmable gate array (FPGA). The invention may also be implemented in software.

What is claimed is:

1. A method for generating a constrained codeword, the method comprising:

receiving a dataword;

encoding the dataword along an enumerative coding graph to generate an enumerative codeword, wherein the enumerative coding graph comprises a plurality states each associated with a cardinality; and precoding the enumerative codeword to generate the constrained codeword.

2. The method of claim 1, wherein the constrained codeword is generated having a run-length limit and a DC limit.

3. The method of claim 1, wherein at least one of the cardinalities is shared by two of the states.

4. The method of claim 1, wherein the cardinality for a state is calculated recursively based on cardinalities of subsequent states.

5. The method of claim 1, wherein the cardinalities are calculated based on a run-length limit constraint.

6. The method of claim 1, wherein the cardinalities are rounded down to reduce a span of the cardinalities.

7. The method of claim 1, further comprising calculating the cardinality for a first state by:
determining a number of codewords that can be generated from the first state as a candidate cardinality;
reducing the candidate cardinality if the candidate cardinality allows for a potential run-length violation;
reducing the candidate cardinality if the candidate cardinality is greater than a cardinality of a second state that is grouped with the first state;
reducing the candidate cardinality if the candidate cardinality has a span greater than an allowed span; and
assigning the candidate cardinality as the cardinality of the first state.

8. The method of claim 1, wherein each of the states in the enumerative coding graph is associated with a bit in the constrained codeword.

9. The method of claim 1, wherein each of the plurality of states comprises a first branch and a second branch.

10. The method of claim 9, wherein the plurality of states and the branches form a plurality of paths through the enumerative coding graph.

11. The method of claim 10, wherein each path through the enumerative coding graph defines an enumerative codeword.

12. The method of claim 10, wherein each path through the enumerative coding graph satisfies a DC limit constraint for the constrained code.

13. The method of claim 1, wherein the encoding comprises:
comparing the dataword with the cardinality associated with a state in the enumerative coding graph;
generating a first output bit and following a first branch to a first next state, when the dataword is less than the cardinality; and
generating a second output bit, setting the dataword equal to the dataword minus the cardinality, and following a second branch to a second next state, when the dataword is less than the cardinality.

14. The method of claim 1, wherein the encoding further comprises:
splitting the dataword into at least two portions;
encoding each of the portions in parallel; and
combining the encoded portions.

15. The method of claim 14, wherein the combining comprises interleaving the encoded portions.

16. The method of claim 14, wherein encoding the portions in parallel comprises selecting a default initial state in the enumerative coding graph.

17. The method of claim 1, wherein the dataword comprises a partial dataword and encoding the partial dataword comprises encoding the partial dataword along an initial portion of the enumerative coding graph.

18. The method of claim 1, wherein the dataword comprises a partial dataword and encoding the partial dataword comprises encoding the partial dataword along a terminal portion of the enumerative coding graph.

19. A method for decoding a constrained codeword, the method comprising:
receiving the constrained codeword;
decoding the constrained codeword using a postcoder; and
decoding the postcoded codeword along an enumerative coding graph, wherein the enumerative coding graph comprises a plurality states each associated with a cardinality and wherein decoding the postcoded codeword comprises summing each of the cardinalities associated with a first postcoded codeword bit.

20. The method of claim 19, wherein the decoding further comprises:
splitting the postcoded codeword into at least two portions;
decoding each of the portions in parallel; and
combining the decoded portions.

21. A system for generating a constrained codeword, the system comprising:
an enumerative encoder that encodes a received dataword along an enumerative coding graph to generate an enumerative codeword, wherein the enumerative coding graph comprises a plurality states each associated with a cardinality; and
a precoder that encodes the enumerative codeword to generate the constrained codeword.

22. The system of claim 21, wherein the constrained codeword is generated having a run-length limit and a DC limit.

23. The system of claim 22, wherein the system computes a cardinality for a first state and is operative to:
determine a number of codewords that can be generated from the first state as a candidate cardinality;
reduce the candidate cardinality if the candidate cardinality allows for a potential run-length violation;
reduce the candidate cardinality if the candidate cardinality is greater than a cardinality of a second state that is grouped with the first state;
reduce the candidate cardinality if the candidate cardinality has a span greater than an allowed span; and
assign the candidate cardinality as the cardinality of the first state.

24. The system of claim 22, wherein the enumerative encoder:
splits the dataword into at least two portions;
encodes each of the portions in parallel; and
combines the encoded portions.

25. A system for decoding a constrained codeword, the system comprising:
a postcoder that decodes a received constrained codeword;
an enumerative decoder that decodes the postcoded codeword along an enumerative coding graph, wherein the enumerative coding graph comprises a plurality states each associated with a cardinality and wherein the enumerative decoder sums each of the cardinalities associated with a first postcoded codeword bit.

26. The system of claim 25, wherein the enumerative decoder:
splits the postcoded codeword into at least two portions;
decodes each of the portions in parallel; and
combines the decoded portions.

* * * * *